(12) United States Patent
Lung et al.

(10) Patent No.: US 9,336,879 B2
(45) Date of Patent: May 10, 2016

(54) MULTIPLE PHASE CHANGE MATERIALS IN AN INTEGRATED CIRCUIT FOR SYSTEM ON A CHIP APPLICATION

(71) Applicant: MACRONIX INTERNATIONAL CO., LTD., Hsinchu (TW)

(72) Inventors: Hsiang-Lan Lung, Ardsley, NY (US); Chao-I Wu, Zhubei (TW); Wei-Chih Chien, Sijhih (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/603,647

(22) Filed: Jan. 23, 2015

(65) Prior Publication Data

US 2015/0214479 A1 Jul. 30, 2015

Related U.S. Application Data

(60) Provisional application No. 61/930,967, filed on Jan. 24, 2014.

(51) Int. Cl.
*H01L 21/8242* (2006.01)
*G11C 13/00* (2006.01)
*H01L 45/00* (2006.01)

(52) U.S. Cl.
CPC ........ *G11C 13/0069* (2013.01); *G11C 13/0004* (2013.01); *G11C 13/0064* (2013.01); *H01L 45/06* (2013.01); *H01L 45/144* (2013.01)

(58) Field of Classification Search
CPC ........... G11C 13/0004; G11C 13/0064; G11C 13/0069; H01L 45/06; H01L 45/144
USPC ............ 438/253, 14, 238, 588, 3; 257/421, 2, 257/315, 306, 246
See application file for complete search history.

(56) References Cited

U.S. PATENT DOCUMENTS

| 3,271,591 A | 9/1966 | Ovshinsky |
| 3,530,441 A | 9/1970 | Ovshinsky |

(Continued)

FOREIGN PATENT DOCUMENTS

| CN | 101436643 A | 5/2009 |
| TW | 250617 B | 3/2006 |

(Continued)

OTHER PUBLICATIONS

Burr, Geoffrey W. et al.; Phase change memory technology; Mar. 30, 2010; Journal of Vacuum Science and Technology B, vol. 28, issue 2; pp. 223-262.

(Continued)

*Primary Examiner* — Mohammed Shamsuzzaman
(74) *Attorney, Agent, or Firm* — Haynes Beffel & Wolfeld LLP

(57) ABSTRACT

A device includes first and second pluralities of memory cells with memory elements and first and second capping materials on the first and second pluralities of memory cells. First and second capping materials can comprise lower and higher density silicon nitrides. The memory elements can include a programmable resistance memory material, and the capping materials can contact the memory elements. The first and second pluralities of memory cells can have a common cell structure. The first memory cells in the can comprise a top and bottom electrodes with a memory material therebetween and the first capping material contacting the memory material. Control circuits can apply different write algorithms to the first and second pluralities of memory cells. The first and second sets of memory cells can have different operational memory characteristics by forming the first and second capping layers using different capping materials but with the same cell structure.

8 Claims, 16 Drawing Sheets

(56) References Cited

U.S. PATENT DOCUMENTS

| | | | |
|---|---|---|---|
| 4,177,475 A | 12/1979 | Holmberg | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,198,384 A * | 3/1993 | Dennison | H01L 27/10852 257/E21.009 |
| 5,332,923 A | 7/1994 | Takeuchi | |
| 5,389,566 A | 2/1995 | Lage | |
| 5,391,901 A | 2/1995 | Tanabe | |
| 5,515,488 A | 5/1996 | Hoppe et al. | |
| 5,534,712 A | 7/1996 | Ovshinsky et al. | |
| 5,550,396 A | 8/1996 | Tsutsumi | |
| 5,596,522 A | 1/1997 | Ovshinsky et al. | |
| 5,687,112 A | 11/1997 | Ovshinsky | |
| 5,688,713 A | 11/1997 | Linliu et al. | |
| 5,716,883 A | 2/1998 | Tseng | |
| 5,751,012 A | 5/1998 | Wolstenholme et al. | |
| 5,754,472 A | 5/1998 | Sim | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,825,046 A | 10/1998 | Czubatyj et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,033,535 A | 3/2000 | Ohno et al. | |
| 6,034,882 A | 3/2000 | Johnson et al. | |
| 6,046,951 A | 4/2000 | El Hajji | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,088,269 A | 7/2000 | Lambertson | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,143,636 A | 11/2000 | Forbes et al. | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,507,061 B1 | 1/2003 | Klersy et al. | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda | |
| 6,555,858 B1 | 4/2003 | Jones et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung | |
| 6,791,102 B2 | 9/2004 | Johnson et al. | |
| 6,797,979 B2 * | 9/2004 | Chiang | H01L 27/2409 257/3 |
| 6,800,504 B2 | 10/2004 | Li et al. | |
| 6,805,563 B2 | 10/2004 | Ohashi | |
| 6,815,704 B1 | 11/2004 | Chen | |
| 6,838,692 B1 | 1/2005 | Lung | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,897,467 B2 | 5/2005 | Doan et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,956,261 B2 | 10/2005 | Shibata | |
| 6,969,866 B1 | 11/2005 | Lowrey et al. | |
| 6,972,428 B2 | 12/2005 | Maimon | |

(56) References Cited

U.S. PATENT DOCUMENTS

| | | |
|---|---|---|
| 6,972,430 B2 | 12/2005 | Casagrande et al. |
| 6,977,181 B1 | 12/2005 | Raberg |
| 6,992,932 B2 | 1/2006 | Cohen |
| 7,018,911 B2 | 3/2006 | Lee et al. |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal et al. |
| 7,277,317 B2 | 10/2007 | Le Phan |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,355,238 B2 | 4/2008 | Takata et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,394,088 B2 | 7/2008 | Lung |
| 7,394,089 B2 | 7/2008 | Doyle et al. |
| 7,397,060 B2 | 7/2008 | Lung |
| 7,423,300 B2 | 9/2008 | Lung et al. |
| 7,426,134 B2 | 9/2008 | Happ et al. |
| 7,442,603 B2 * | 10/2008 | Lai ................ G11C 11/5678 257/E21.004 |
| 7,453,081 B2 | 11/2008 | Happ et al. |
| 7,485,891 B2 | 2/2009 | Hamann et al. |
| 7,504,653 B2 | 3/2009 | Lung |
| 7,560,337 B2 | 7/2009 | Ho et al. |
| 7,561,463 B2 * | 7/2009 | Lung ................ G11C 13/0004 365/148 |
| 7,579,613 B2 | 8/2009 | Lung et al. |
| 7,606,059 B2 | 10/2009 | Toda |
| 7,623,370 B2 | 11/2009 | Toda et al. |
| 7,679,163 B2 | 3/2010 | Chen et al. |
| 7,741,631 B2 * | 6/2010 | Kuh ................ G11C 13/0004 257/2 |
| 7,745,807 B2 | 6/2010 | Chen et al. |
| 7,759,770 B2 | 7/2010 | Happ et al. |
| 7,778,063 B2 | 8/2010 | Brubaker et al. |
| 7,800,159 B2 | 9/2010 | Widjaja et al. |
| 7,800,943 B2 | 9/2010 | Ravasio et al. |
| 7,804,083 B2 | 9/2010 | Chen |
| 7,868,313 B2 | 1/2011 | Breitwisch et al. |
| 7,875,873 B2 | 1/2011 | Chen et al. |
| 7,893,419 B2 | 2/2011 | Hudgens et al. |
| 7,893,420 B2 | 2/2011 | Liang et al. |
| 7,903,457 B2 | 3/2011 | Lung |
| 7,913,215 B2 | 3/2011 | Chou et al. |
| 8,017,930 B2 * | 9/2011 | Philipp ................ H01L 45/06 257/2 |
| 8,048,755 B2 | 11/2011 | Sandhu et al. |
| 8,084,842 B2 | 12/2011 | Chen |
| 8,192,592 B2 | 6/2012 | Kim et al. |
| 8,374,019 B2 | 2/2013 | Wu et al. |
| 8,962,384 B2 * | 2/2015 | Redaelli ................ H01L 45/06 257/5 |
| 2002/0042158 A1 | 4/2002 | Kersch et al. |
| 2002/0070457 A1 | 6/2002 | Sun et al. |
| 2002/0074658 A1 | 6/2002 | Chiang |
| 2002/0113273 A1 | 8/2002 | Hwang et al. |
| 2002/0137307 A1 * | 9/2002 | Kim ................ H01L 21/31055 438/432 |
| 2003/0003647 A1 | 1/2003 | Dennison et al. |
| 2003/0072195 A1 | 4/2003 | Mikolajick |
| 2003/0095426 A1 | 5/2003 | Hush et al. |
| 2003/0123277 A1 * | 7/2003 | Lowrey ................ G11C 11/56 365/148 |
| 2003/0186481 A1 | 10/2003 | Lung |
| 2003/0215978 A1 | 11/2003 | Maimon et al. |
| 2004/0026686 A1 | 2/2004 | Lung |
| 2004/0051094 A1 | 3/2004 | Ooishi |
| 2004/0109351 A1 | 6/2004 | Morimoto et al. |
| 2004/0114317 A1 | 6/2004 | Chiang et al. |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0019975 A1 | 1/2005 | Lee et al. |
| 2005/0029502 A1 | 2/2005 | Hudgens |
| 2005/0062087 A1 | 3/2005 | Chen et al. |
| 2005/0093022 A1 * | 5/2005 | Lung ................ H01L 45/06 257/200 |
| 2005/0095779 A1 * | 5/2005 | Park ................ H01L 21/76838 438/238 |
| 2005/0127347 A1 * | 6/2005 | Choi ................ H01L 21/76816 257/2 |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 * | 9/2005 | Osada ................ H01L 27/24 365/230.03 |
| 2005/0212024 A1 | 9/2005 | Happ |
| 2005/0212026 A1 | 9/2005 | Chung et al. |
| 2005/0212037 A1 * | 9/2005 | Pinnow ................ H01L 27/2436 257/326 |
| 2005/0215009 A1 | 9/2005 | Cho |
| 2005/0263829 A1 * | 12/2005 | Song ................ H01L 29/7843 257/379 |
| 2006/0001174 A1 | 1/2006 | Matsui |
| 2006/0003263 A1 | 1/2006 | Chang |
| 2006/0006472 A1 | 1/2006 | Jiang |
| 2006/0024950 A1 | 2/2006 | Choi et al. |
| 2006/0038221 A1 | 2/2006 | Lee et al. |
| 2006/0049447 A1 | 3/2006 | Lee et al. |
| 2006/0066156 A1 | 3/2006 | Dong et al. |
| 2006/0073642 A1 | 4/2006 | Yeh et al. |
| 2006/0077741 A1 | 4/2006 | Wang et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118853 A1 | 6/2006 | Takata et al. |
| 2006/0118913 A1 * | 6/2006 | Yi ................ H01L 27/2436 257/613 |
| 2006/0124916 A1 | 6/2006 | Lung |
| 2006/0126395 A1 | 6/2006 | Chen et al. |
| 2006/0126423 A1 | 6/2006 | Aratani et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0172067 A1 | 8/2006 | Ovshinsky et al. |
| 2006/0175596 A1 | 8/2006 | Happ et al. |
| 2006/0198183 A1 | 9/2006 | Kawahara et al. |

(56) References Cited

U.S. PATENT DOCUMENTS

| | | |
|---|---|---|
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2006/0291291 A1* | 12/2006 | Hosono ................. G11C 16/12 365/185.22 |
| 2007/0008786 A1 | 1/2007 | Scheuerlein |
| 2007/0012986 A1* | 1/2007 | Choi ................... H01L 27/2436 257/306 |
| 2007/0029606 A1 | 2/2007 | Noh et al. |
| 2007/0029676 A1* | 2/2007 | Takaura ............. G11C 13/0004 257/758 |
| 2007/0030721 A1 | 2/2007 | Segal et al. |
| 2007/0037101 A1 | 2/2007 | Morioka |
| 2007/0045605 A1 | 3/2007 | Hsueh |
| 2007/0045606 A1 | 3/2007 | Magistretti et al. |
| 2007/0052007 A1* | 3/2007 | Jung ..................... H01L 27/115 257/315 |
| 2007/0080421 A1* | 4/2007 | Lee ....................... H01L 27/101 257/486 |
| 2007/0096162 A1 | 5/2007 | Happ et al. |
| 2007/0097739 A1 | 5/2007 | Happ et al. |
| 2007/0108077 A1 | 5/2007 | Lung et al. |
| 2007/0108429 A1* | 5/2007 | Lung ...................... H01L 45/06 257/2 |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0210348 A1* | 9/2007 | Song ................... H01L 27/2436 257/246 |
| 2007/0215852 A1* | 9/2007 | Lung ...................... H01L 45/06 257/4 |
| 2007/0224726 A1 | 9/2007 | Chen et al. |
| 2007/0235710 A1 | 10/2007 | Matsuzaki et al. |
| 2007/0235811 A1* | 10/2007 | Furukawa ........... H01L 27/0629 257/359 |
| 2007/0236989 A1 | 10/2007 | Lung |
| 2007/0246699 A1 | 10/2007 | Lung |
| 2007/0246782 A1 | 10/2007 | Philipp et al. |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0267620 A1 | 11/2007 | Happ |
| 2007/0267721 A1 | 11/2007 | Kuh et al. |
| 2007/0274121 A1* | 11/2007 | Lung ................. G11C 11/5678 365/148 |
| 2007/0278529 A1* | 12/2007 | Lai ....................... H01L 27/2436 257/209 |
| 2007/0285960 A1 | 12/2007 | Lung et al. |
| 2007/0290185 A1* | 12/2007 | Wang ................. H01L 27/2463 257/3 |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0017842 A1 | 1/2008 | Happ et al. |
| 2008/0019170 A1 | 1/2008 | Happ et al. |
| 2008/0025089 A1 | 1/2008 | Scheuerlein et al. |
| 2008/0035907 A1 | 2/2008 | Czubatyj et al. |
| 2008/0043520 A1 | 2/2008 | Chen |
| 2008/0078984 A1* | 4/2008 | Park .................... H01L 27/2409 257/4 |
| 2008/0094871 A1 | 4/2008 | Parkinson |
| 2008/0099791 A1* | 5/2008 | Lung ................. G11C 11/5678 257/213 |
| 2008/0101110 A1 | 5/2008 | Happ et al. |
| 2008/0106923 A1* | 5/2008 | Lung ................. G11C 11/5678 365/129 |
| 2008/0116441 A1 | 5/2008 | Raghuram et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180989 A1* | 7/2008 | Baek .................. G11C 11/5607 365/158 |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0203375 A1* | 8/2008 | Lung ...................... H01L 45/04 257/3 |
| 2008/0224119 A1 | 9/2008 | Burr et al. |
| 2008/0225489 A1 | 9/2008 | Cai et al. |
| 2008/0230373 A1* | 9/2008 | Kim ................... C23C 14/0623 204/192.15 |
| 2009/0014704 A1 | 1/2009 | Chen et al. |
| 2009/0032794 A1 | 2/2009 | Hsiao |
| 2009/0067230 A1* | 3/2009 | Koh ....................... G11C 11/56 365/163 |
| 2009/0078924 A1 | 3/2009 | Liang et al. |
| 2009/0148980 A1 | 6/2009 | Yu |
| 2009/0200618 A1* | 8/2009 | Boescke ........... H01L 21/28079 257/407 |
| 2009/0230378 A1* | 9/2009 | Ryoo ................. G11C 11/5664 257/4 |
| 2009/0298223 A1 | 12/2009 | Cheek et al. |
| 2010/0012917 A1* | 1/2010 | Takaura ................. G11C 8/08 257/4 |
| 2010/0038743 A1* | 2/2010 | Lee .................... H01L 21/2007 257/499 |
| 2010/0044665 A1 | 2/2010 | Jedema |
| 2010/0163832 A1* | 7/2010 | Kau .................... H01L 27/2427 257/4 |
| 2010/0193763 A1 | 8/2010 | Chen et al. |
| 2010/0291747 A1 | 11/2010 | Lung et al. |
| 2010/0328996 A1 | 12/2010 | Shih et al. |
| 2011/0034003 A1 | 2/2011 | Lung |
| 2011/0049456 A1 | 3/2011 | Lung et al. |
| 2011/0051500 A1* | 3/2011 | Takagi ............... G11C 13/0007 365/148 |
| 2011/0097825 A1* | 4/2011 | Cheng .................... H01L 22/12 438/14 |
| 2011/0110018 A1 | 5/2011 | Ishii et al. |
| 2011/0140066 A1 | 6/2011 | Liang et al. |
| 2011/0291065 A1* | 12/2011 | Quick ...................... H01L 45/06 257/4 |
| 2012/0020140 A1 | 1/2012 | Chen |

(56) References Cited

U.S. PATENT DOCUMENTS

| | | | |
|---|---|---|---|
| 2012/0075925 A1* | 3/2012 | Lung | H01L 45/06 365/163 |
| 2013/0187120 A1* | 7/2013 | Redaelli | H01L 45/06 257/5 |
| 2014/0136755 A1* | 5/2014 | Hyde | G06F 15/7814 711/103 |
| 2014/0136903 A1* | 5/2014 | Hyde | G06F 11/004 714/47.3 |
| 2014/0189207 A1* | 7/2014 | Sinclair | G06F 12/0246 711/103 |
| 2014/0208041 A1* | 7/2014 | Hyde | G06F 12/0831 711/146 |
| 2014/0246741 A1* | 9/2014 | Guo | H01L 43/12 257/421 |
| 2014/0281231 A1* | 9/2014 | Lee | H01L 43/02 711/118 |
| 2015/0006994 A1* | 1/2015 | Kim | G11C 7/08 714/763 |
| 2015/0050803 A1* | 2/2015 | Lee | H01L 27/11582 438/588 |
| 2015/0263071 A1* | 9/2015 | Sim | H01L 27/2463 710/5 |
| 2015/0280117 A1* | 10/2015 | Boniardi | H01L 45/128 257/5 |
| 2015/0357380 A1* | 12/2015 | Pellizzer | H01L 27/2463 257/5 |
| 2016/0005760 A1* | 1/2016 | Lee | H01L 27/11582 257/324 |

FOREIGN PATENT DOCUMENTS

| | | |
|---|---|---|
| TW | 2009241184 | 6/2009 |
| TW | 201143085 | 12/2011 |
| TW | 201205785 | 2/2012 |
| WO | 0079539 | 12/2000 |
| WO | 0145108 A1 | 6/2001 |
| WO | 0225733 A2 | 3/2002 |

OTHER PUBLICATIONS

Lung, H.L. et al.; Towards the integration of both ROM and RAM functions phase change memory cells on a single die for System-On-Chip (SOC) applications; presented on 2 pgs.

Noboru Yamada, "Potential of Ge—Sb—Te Phase-Change Optical Disks for High-Data-Rate Recording", SPIE v.3109, pp. 28-37 (1997).

Cheng, H-Y et al., "The Crystallization Behavior of Ge1SbxTe1 Phase-Change Materials," unpublished presentation materials, 2010 MRS Spring Meeting, Apr. 5-8, 2010, 30 pp.

Kojima, R. et al., "Acceleration of Crystallization Speed by Sn Addition to Ge—Sb—Te Phase-Change Recording Material," Jpn. J. Appl. Phys., vol. 40, Part 1, No. 10, Oct. 2001, pp. 5930-5937.

Yamada, N. et al., "High Speed Overwritable Phase Change Optical Disk Material," Proc. Int. Symp. on Optical Memory, Tokyo, Jpn. J. Appl. Phys., vol. 26, (1987) Supplement 26-4, pp. 61-66.

Cheng H-Y et al., "The crystallization behavior of Ge1SbxTe1 phase-change materials," abstract of invited paper for Apr. 2010 MRS Spring Meeting, 2pp.

N. Yamada et al., "Rapid-phase transitions of Ge Te—Sb2 Te3 pseudobinary amorphous thin films for an optical disk memory," J. Appl. Phys. 69(5), Mar. 1991, pp. 2849-2856.

E. Morales-Sanchez, "Structural, electric and kinetic parameters of ternary alloys of GeSbTe," Thin Solid Films, vol. 471, 2005, pp. 243-247.

N. Matsuzaki et al., "Oxygen-doped GeSbTe Phase-change Memory Cells Featuring 1.5-V/100-μA Standard 0.13-μm CMOS Operations," IEDM Tech. Digest, vol. 758, 2005, 4pp.

M. Okuda et al., "Explosive Crystallization Mechanism in Sb-rich Eutectic Materials of Phase Change Optical Memory," Mater. Res. Soc. Proc. vol. 803, Jan. 2003, 7pp.

L. Van Pieterson, et al., "Phase-change recording materials with a growth-dominated crystallization mechanism: A materials overview," J. Appl. Phys. vol. 97:083520, 2005, 7pp.

Y.H. Shih et al., "Understanding Amorphous States of Phase-Change Memory Using Frenkel-Poole Model," IEDM Tech. Digest, vol. 207, 2009, pp. 31.7.1-31.7.4.

Bez, R., "Chalcogenide PCM: a Memory Technology for Next Decade," Electron Devices Meeting (IEDM), 2009 IEEE International, pp. 1-4.

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 50nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Happ, T. D. et al., "Novel One-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

(56) References Cited

OTHER PUBLICATIONS

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge—Sn—Sb—Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stefan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Wu J.Y. et al., "A Low Power Phase Change Memory Using Thermally Confined TaN/tiN Bottom Electrode," 2011 IEEE Int'l Electron Devices Meeting (IEDM), pp. 3.2.1-3.2.4.

Sadeghipour S.M., et al., "Phase change random access memory, thermal analysis," Thermal and Thermomechanical Phenomena in Electronics Systems, ITHERM '06, 10th Intersociety Conf., 2006, pp. 660-665.

U.S. Appl. No. 13/089,934, filed Apr. 19, 2011 for Sidewall Thin Film Electrode With Self-Aligned Top Electrode and Programmable Resistance Memory, by H-L Lung.

U.S. Appl. No. 13/191,490, filed Jul. 27, 2011 for Phase Change Memory Electrode with Sheath for Reduced Programming Current, by M.J. Breitwisch.

\* cited by examiner

LTSiN

HTSiN

MULTIPLE PHASE CHANGE MATERIALS IN AN INTEGRATED CIRCUIT FOR SYSTEM ON A CHIP APPLICATION

CROSS-REFERENCE TO OTHER APPLICATIONS

This application claims the benefit of U.S. provisional patent application No. 61/930,967, filed on 24 Jan. 2014.

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND

1. Field of the Invention

The present technology relates to integrated circuit devices having two types of memory, such as with System-On-Chip (SOC) applications, and methods for manufacturing such devices.

2. Description of Related Art

In general, system-on-chip (SOC) technology is the integration of multiple subsystems of an electronic system within a single integrated circuit, and may contain digital, analog, mixed-signal, and radio-frequency functions. The various types of subsystems that may be integrated within the integrated circuit include microprocessor and microcontroller cores, digital signal processors (DSPs), configurable logic units, memory blocks, timing sources, external interfaces, and power management circuits, among others. An SOC consists of both the hardware described above, as well as the software that controls the subsystems. The term "system-on-a-chip" may be used to describe complex application specific integrated circuits (ASIC), where many functions previously achieved by combining multiple integrated circuits on a board are now provided by one single integrated circuit. This level of integration greatly reduces the size and power consumption of the system, while generally also reducing manufacturing costs.

In order to fulfill the memory performance requirements for the various functions of the SOC, different types of memory circuits serving different purposes are typically embedded at various locations in the integrated circuit for memory applications such as random access memory (RAM), flash memory, and read only memory (ROM). However, integration of different types of memory devices for the various memory applications in an SOC can be difficult and result in highly complex designs and manufacturing processes.

It is therefore desirable to provide memory on a single integrated circuit addressing different memory performance requirements such as those demanded of the various functions of SOCs, while also addressing the issue of design integration. It is also desirable to provide methods for manufacturing such devices.

SUMMARY

A device includes first and second pluralities of memory cells. The first plurality of memory cells includes a first capping material on the first plurality of memory cells. The second plurality of memory cells includes a second capping material on the second plurality of memory cells. The first capping material is different from the second capping material. Circuitry is coupled to the first and second pluralities of memory cells configured to apply different write processes to them (e.g. shorter write pulses or write operations, for higher speed programming in one of the pluralities of memory cells, and longer write pulses or write operations, for longer data retention in the other), or to allocate them for different cycling endurance specifications (e.g. specifications for main memory that is accessed often in one of the pluralities of memory cells, or for long term storage in the other).

Examples of the device can include one or more the following. The first capping material can comprise a silicon nitride. The second capping material can comprise a silicon nitride having a higher density than the silicon nitride of the first capping material. The memory cells can have memory elements including a programmable resistance memory material, and the first capping material and the second capping material can contact the memory elements of the corresponding first and second pluralities of memory cells. The memory cells in the first and second pluralities of memory cells can have memory elements comprising a $Ge_xSb_yTe_z$ phase change material, and the first capping material can comprise a lower density silicon nitride, and the second capping material can comprise a higher density silicon nitride deposited at a higher temperature than that of the first capping material. The first capping material can comprise a material with refractive index of less than 2.016 and greater than 1.8 typically about 1.95, and a density of less than 3.2 g/cm$^3$ and greater than 2.4 g/cm$^3$, typically about 2.6 g/cm$^3$. The second capping material can comprise a material with refractive index of greater than or equal to 2.016 and less than 2.2, and a density of greater than or equal to 3.2 g/cm$^3$ and less than 3.5 g/cm$^3$.

The first and second pluralities of memory cells can have a common cell structure. The first and second pluralities of memory cells can have memory elements comprising phase change material. The first capping material can comprise a first silicon nitride layer and the second capping material can comprise a second silicon nitride layer having a higher density than the first silicon nitride layer, and the memory cells in the first and second pluralities of memory cells can have memory elements comprising $Ge_xSb_yTe_z$. The memory cells of the first plurality of memory cells can comprise a top electrode, a bottom electrode, and a memory material, the memory material being between the top and bottom electrodes, with the first capping material contacting the memory material. Control circuits can apply a write algorithm to the first plurality of memory cells and a different write algorithm to the second plurality of memory cells.

A further example of a memory device includes first and second pluralities of memory cells and circuitry. The first plurality of memory cells has a cell structure with memory elements comprising phase change material, and a first capping layer of silicon nitride contacting the memory elements in the first plurality of memory cells. The second plurality of memory cells has a cell structure with memory elements comprising phase change material, and a second capping layer of silicon nitride contacting the memory elements in the second plurality of memory cells. The cell structures of the first and second pluralities of memory cells differ only in the materials of the first and second capping layers. The silicon nitride in the first capping layer has a lower density than the silicon nitride in the second capping layer. The circuitry is configured to apply a higher speed write operation to the first plurality of memory cells than to the second plurality of memory cells.

An example of a method for providing first and second sets of memory cells of a memory device with first and second operational memory characteristics can be carried out as follows. A first capping layer is formed on the first set of memory cells using a first capping material. A second capping layer is formed on the second set of memory cells using a second capping material different than the first capping material. The first and second sets of memory cells are formed to have the same cell structure.

Examples of the memory cells providing method can include one or more the following. The first capping material can comprise at least one of $SiO_x$ and $SiN_x$ and $S_oO_xF_yC_z$. The second capping material can comprise at least one of $SiN_x$, $Al_2O_3$, $HfO_2$ and $Ta_2O_5$. The first and second capping materials can be the same material, and the first and second capping layer forming steps can be carried out at different temperatures. The first and second capping layer forming steps can be different steps and can include using the same memory material for the first and second sets of memory cells, and choosing the first and second capping layer forming steps so that the first set of memory cells has a faster switching speed characteristic than the second set of memory cells, and the second set of memory cells has a better data retention characteristic than the first set of memory cells. Silicon nitride can be used for both the first and second capping materials, and first and second capping layer forming steps can be carried out at a lower temperature for forming the first capping layer and a higher temperature for forming the second capping layer. The memory cells can have memory elements including a programmable resistance memory material, and the first capping material and the second capping material can contact the memory elements of the corresponding first and second pluralities of memory cells. The method can further comprise forming control circuits configured to apply a write algorithm to the first plurality of memory cells and a different write algorithm to the second plurality of memory cells.

Other aspects and advantages of the present invention can be seen on review of the drawings, the detailed description and the claims, which follow.

BRIEF DESCRIPTION OF THE DRAWINGS

FIG. 2 is a cross-sectional view of a prior art mushroom-type memory cell.

FIG. 3 is a cross-sectional view of a prior art bridge-type memory cell.

FIG. 4 shows a cross-sectional view of an active-in-via prior art type memory cell.

FIG. 5 shows a cross-sectional view of a prior art pore-type memory cell.

FIG. 6 illustrates a cross-sectional view of a metal-oxide memory cell.

DETAILED DESCRIPTION

Figure 1:
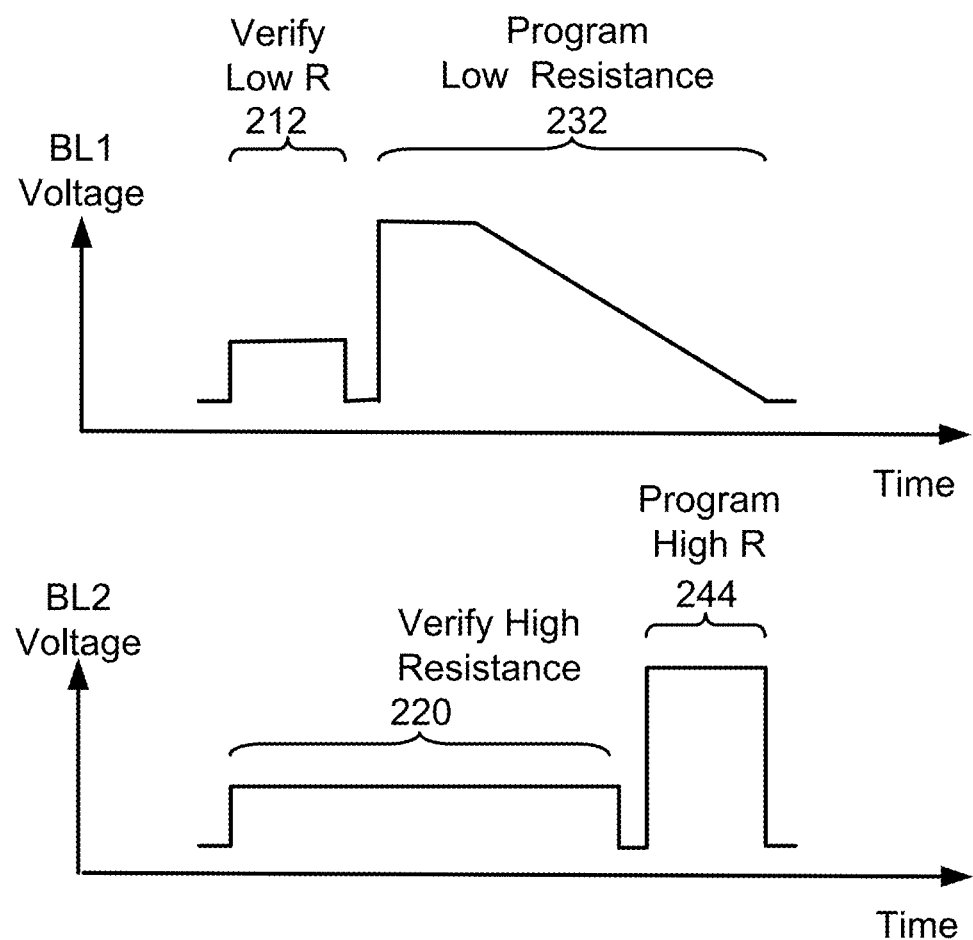
FIG. 1 is a waveform diagram illustrating an implementation of a method for writing a data value to a programmable resistance memory cell.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Technology described herein includes utilizing arrays of programmable resistance memory cells on integrated circuits, where some of the cells are configured to meet longer data retention memory specifications and/or lower cycling endurance specifications, and some are configured to meet higher speed memory specifications and/or higher cycling endurance specifications.

FIG. 1 is a waveform diagram illustrating an implementation of a method for writing a data value to a programmable resistance memory cell, where the data value is represented by first and second programmable resistance ranges. For instance, the first resistance range can have resistance values lower than resistance values in the second resistance range. The data value is written in a write cycle. The write cycle includes a first sequence of alternating verify operations and write operations for writing a first data value represented by the first programmable resistance range, and a second sequence of alternating verify operations and write operations for writing a second data value represented by the second programmable resistance range. A verify operation can be applied before the write sequence begins, and after a write pulse in the sequence. If the verify operation determines that the memory cell does not have a resistance in the resistance range expected by the previous write pulse, another write pulse can then be applied.

As illustrated in the example of FIG. 1, to set a programmable resistance cell based on phase change material to write a first data value represented by the first resistance range (e.g.

Low Resistance or Low R), a sequence of set cycles that include verify and set pulses can be applied. In a set cycle, a set state verify operation (e.g. 212) can be applied to the memory cell. If the cell fails verify, then a set pulse (e.g. 232) is applied to the memory cell. In some embodiments, a single cycle is applied to set the cell. The duration, magnitude and shape of the set pulse can be specified according to the characteristics of the memory cell. In other embodiments, set cycles are applied iteratively, until the cell passes the verify operation signaling that the set operation has succeeded, or until a maximum number of cycles is reached, signaling that the set operation has failed.

To perform a reset operation to write a second data value represented by the second resistance range (e.g. High Resistance or High R) to a memory cell, a sequence of reset cycles that include verify and reset pulses can be applied. In a reset cycle, a reset state verify operation is applied (e.g. 220). If the cell fails the verify operation, a reset pulse (e.g. 244) is applied to the memory cell. In some embodiments, a single cycle is applied to reset the cell. The duration, magnitude and shape of the reset pulse can be specified according to the characteristics of the memory cell. In other embodiments, reset cycles are applied iteratively, until the cell passes the reset verify operation signaling that the reset operation has succeeded, or until a maximum number of cycles is reached, signaling that the reset operation has failed.

The length of time required for these write operations is a critical performance specification. So a programmable resistance array that is configured for a high speed specifications can require a shorter write pulse, or require that the write operations succeed in only one cycle, or in fewer cycles and thus shorter time, or both, than programmable resistance arrays configured for high retention as described herein, which may require a longer pulse or more cycles, or both.

FIGS. 2 to 6 illustrate basic memory cell structures using programmable resistance memory elements which can be deployed in a memory array as described herein, with capping layers. As described herein, memory cells on a single integrated circuit with different materials or combinations of materials in the capping layer can be deployed in different programmable resistance arrays. Logic on the integrated circuits can be configured to operate by applying variant write operations to the different arrays. Also, as described herein, the different arrays can have different endurance characteristics, so that one array can undergo a larger number of read/write cycles than another on the same integrated circuit. Also, the different arrays can have different retention characteristics, so that one array can reliably retain data for longer periods of time than other arrays.

FIGS. 2 to 5 illustrate memory cells based on phase change materials. Embodiments of the phase change materials include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Concentrations of Ge can range from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities, in some embodiments, to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable.

An exemplary method for forming chalcogenide material uses PVD-sputtering or magnetron-sputtering method with source gas(es) of Ar, N2, and/or He, etc., at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

Figure 2:
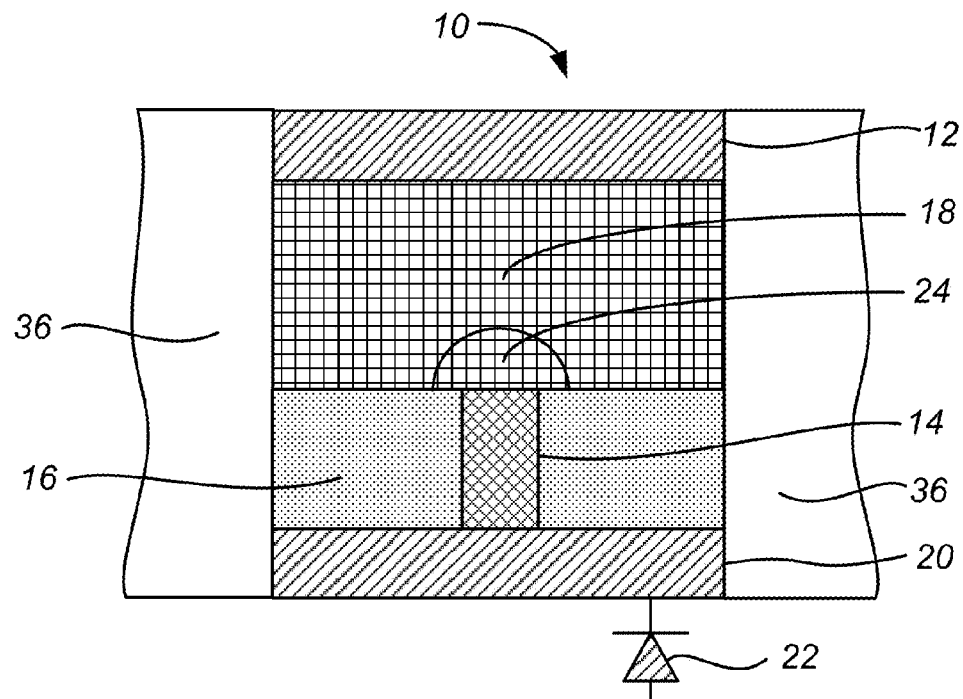
FIGS. 2-6 illustrate different types of prior art memory cells which can be used as part of the technology described below.

FIG. 2 illustrates a simplified cross-sectional view of a prior art mushroom-type memory cell 10 such as found in a memory array. Memory cell 10 includes a top electrode 12, which can be a bit line, a heater or bottom electrode 14, an insulator 16 surrounding the bottom electrode, phase change material 18 coupled to the top electrode 12 and the bottom electrode 14, a contact 20 coupled to the bottom electrode 14, and an access device 22, such as a diode 22 coupled to the contact. The memory cell 10 in the example shown includes a phase change memory material as the programmable resistance material 18 having an active region 24 which changes phase under bias conditions applied during operation of the array. Insulating dielectric materials 36 acts as a capping layer, enclosing the cell and contacting the phase change material.

Figure 3:
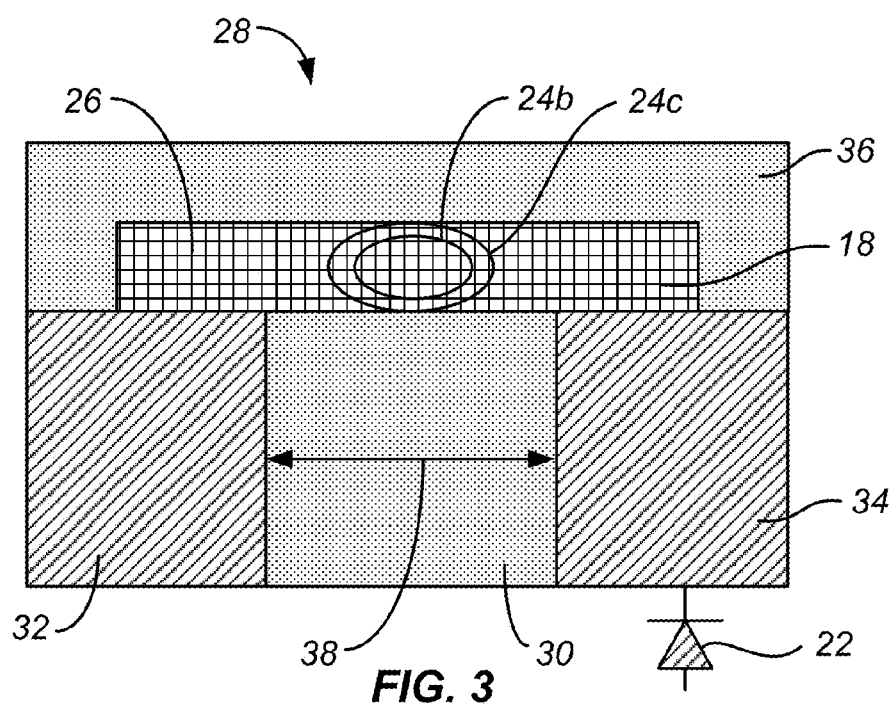

FIG. 3 illustrates a simplified cross-sectional view of a prior art bridge-type memory cell 28. Memory cell 28 includes a dielectric spacer 30 separating first and second electrodes 32 and 34. Dielectric material 36 acts as a capping layer, and surrounds a programmable resistance memory material 18. The memory material 18 extends across the dielectric spacer 30 to contact the first and second electrodes 32, 34, thereby defining an inter-electrode current path between the first and second electrodes 32, 34 having a path length defined by the width 38 of the dielectric spacer 30. The memory cell 28 includes an access device 22 coupled to the second electrode 34.

Figure 4:
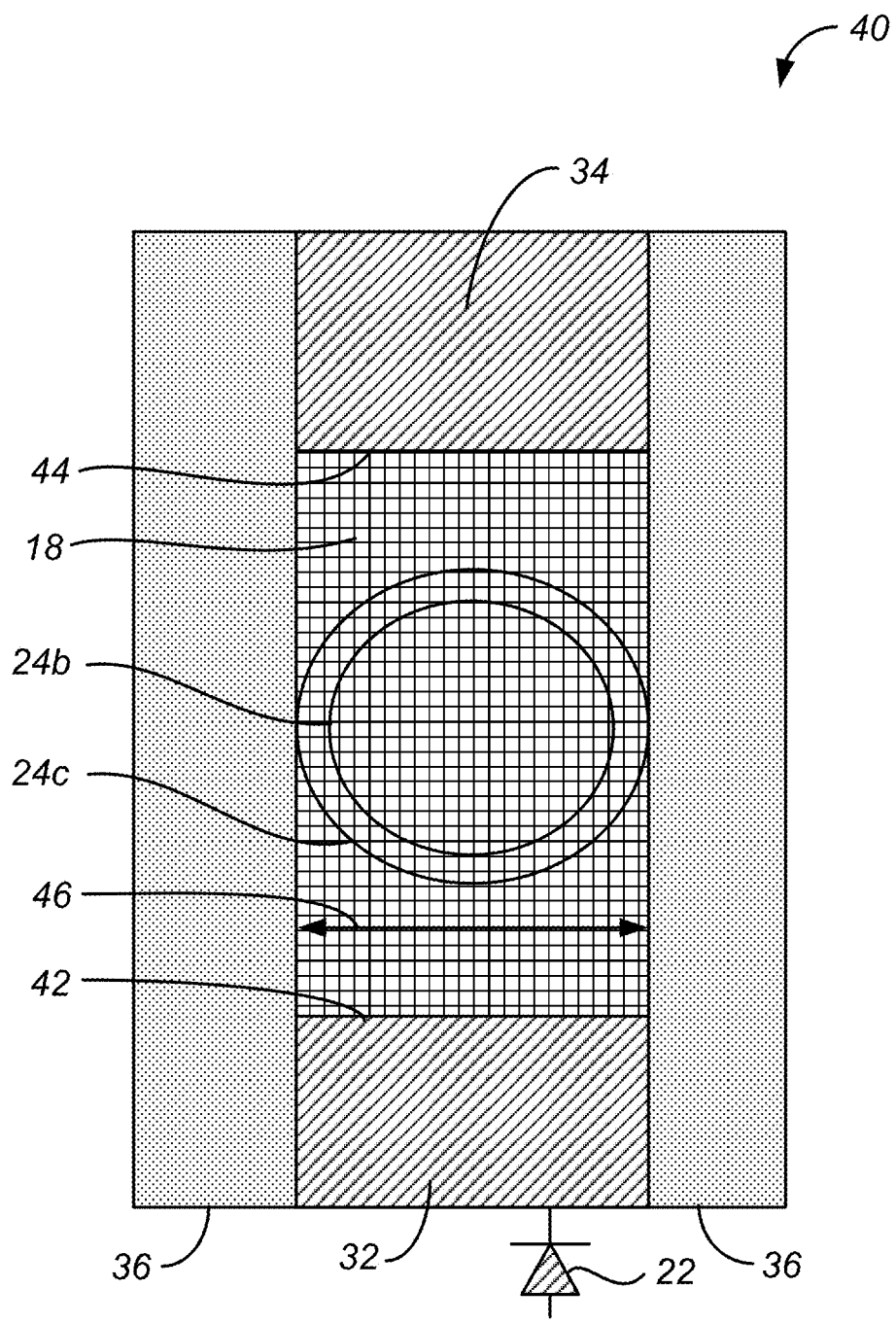

FIG. 4 illustrates a cross-sectional view of an "active-in-via" type memory cell 40. Memory cell 40 includes a memory material 18 contacting first and second electrodes 32, 34 at their top and bottom surfaces 42, 44, respectively. Dielectric material 36 surrounds the memory material 18. The memory material 18 has a width 46 substantially the same in this example, as that of the first and second electrodes 32, 34 to define a multi-layer pillar surrounded by dielectric 36 acting as a capping layer. As used herein, the term "substantially" is intended to accommodate manufacturing tolerances. The memory cell 40 includes an access device 22, such as a diode or transistor, coupled to the electrode 32.

Figure 5:
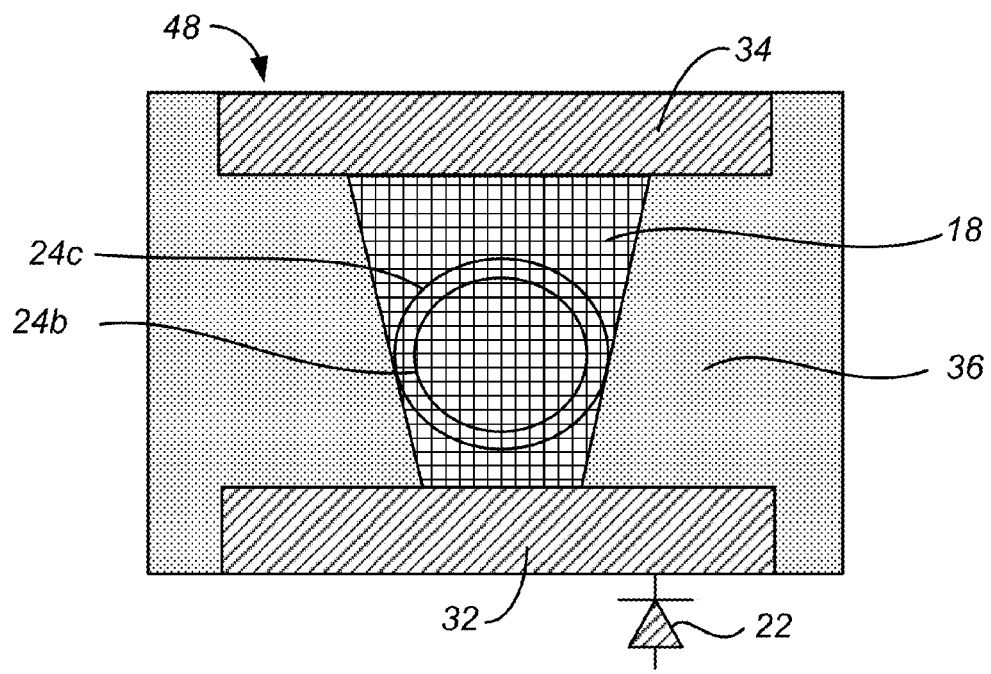

FIG. 5 illustrates a cross-sectional view of a pore-type memory cell 48. Memory cell 48 includes a memory material 18. Dielectric material 36 surrounds the memory material 18, and acts as a capping layer. The memory material 18 contacts first and second electrodes 32, 34 at top and bottom surfaces, respectively. The memory cell includes an access device 22 such as a diode or transistor, coupled to the electrode 32.

The dielectric materials 36 which surround the phase change materials in the cells shown in FIGS. 2 to 5, may include, for example, $SiO_2$, $Si_3N_4$, $SiO_xN_y$ or $Al_2O_3$.

Figure 6:
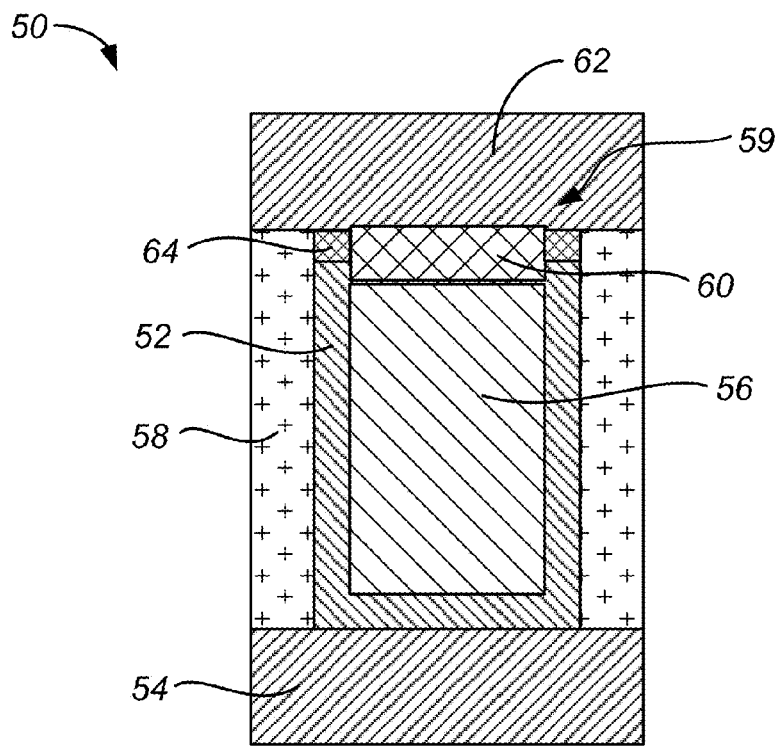

FIG. 6 illustrates a simplified cross-sectional view of a prior art metal-oxide memory cell 50 which can be deployed with different capping materials, as described herein. The memory cell 50 includes a liner layer 52 between a bottom electrode 54 and a conductive element 56. The conductive element 56 is surrounded by the liner layer 52 and extends through a dielectric 58 to contact a memory element 59, memory element 59 including a metal-oxide layer 60 and a metal oxide ring 64. A top electrode 62 is on the memory element 59. As shown in FIG. 6, metal oxide ring 64 of the memory element 59 at the end of liner layer 52 induces a field enhancement effect. The dielectric 58 contacts the metal oxide ring 64 of the memory element 60, and acts as a capping layer. The top electrode 62 is an electrically conductive element which, in some embodiments, is a portion of a bit line. The top electrode 62 may comprise, for example, one or more elements selected from the group consisting of Ti, W, Yb, Tb, Y, Sc, Hf, Zr, Nb, Cr, V, Zn, Re, Co, Rh, Pd, Pt, Mo, Al, Ta, Cu, Pt, Ir, La, Ni, N, 0, and Ru and combinations thereof. In some embodiments, the top electrode 62 may comprise more than one layer of material.

The bottom electrode 54 is an electrically conductive element. The bottom electrode may, for example, comprise doped polysilicon, which may be the terminal of a diode or access transistor. Alternatively, the bottom electrode 54 may comprise, for example, any of the materials discussed above with reference to the top electrode 62.

The conductive element 56 may comprise, for example, any of the materials discussed above with reference to the top electrode 62.

The metal-oxide layer 60 comprises metal-oxide material which is programmable to a plurality of resistance states. In some embodiments, metal-oxide layer 60 may comprise one or more metal oxides from the group of tungsten oxide, titanium oxide, nickel oxide, aluminum oxide, copper oxide, zirconium oxide, niobium oxide, tantalum oxide, titanium nickel oxide, Cr-doped $SrZrO_3$, Cr-doped $SrTiO_3$, PCMO and LaCaMnO. In some embodiments, the memory element 340 may comprise WO/Cu or Ag, TiO/Cu or Ag, NiO/Cu or Ag, AlO/Cu or Ag, CuO/Cu or Ag, ZrO/Cu or Ag, NbO/Cu or Ag, TaO/Cu or Ag, TiNO/Cu or Ag, Cr-doped $SrZrO_3$/Cu or Ag, Cr-doped $SrTiO_3$/Cu or Ag, PCMO/CU or Ag, LaCaMnO/Cu or Ag, and $SiO_2$/Cu or Ag.

The liner layer 52 may comprise, for example, a layer of TiN or a bi-layer of silicon nitride and TiN. Other materials can be used for the liner layer 52 as well.

As shown in FIG. 6, the metal-oxide ring 64 surrounds the metal-oxide layer 60 at the level at which contact to the top electrode 62 is made. The metal-oxide ring 64 may, for example, comprise $TiNO_x$, $SiO_2$, $HfO_x$, $TiNO_x$, $TiO_x$, $AlO_x$, $WO_x$, etc., and is preferably chosen so that the material of the metal-oxide ring 64 has a higher resistance than that of central portion of the memory element 59, that is metal-oxide layer 60.

In the illustrated embodiment the conductive element 56 comprises tungsten, the metal-oxide layer 60 of tungsten oxide, the metal oxide ring 64 of $TiNO_x$, and the liner layer 52 comprises TiN or a bi-layer of silicon nitride and TiN.

In addition to the memory cells, such as phase change memory cells and metal oxide memory cells, described as above, solid state electrolyte (conductive bridge) memory cells and magnetoresistive memory cells can be applicable to the present technology.

Figure 7:
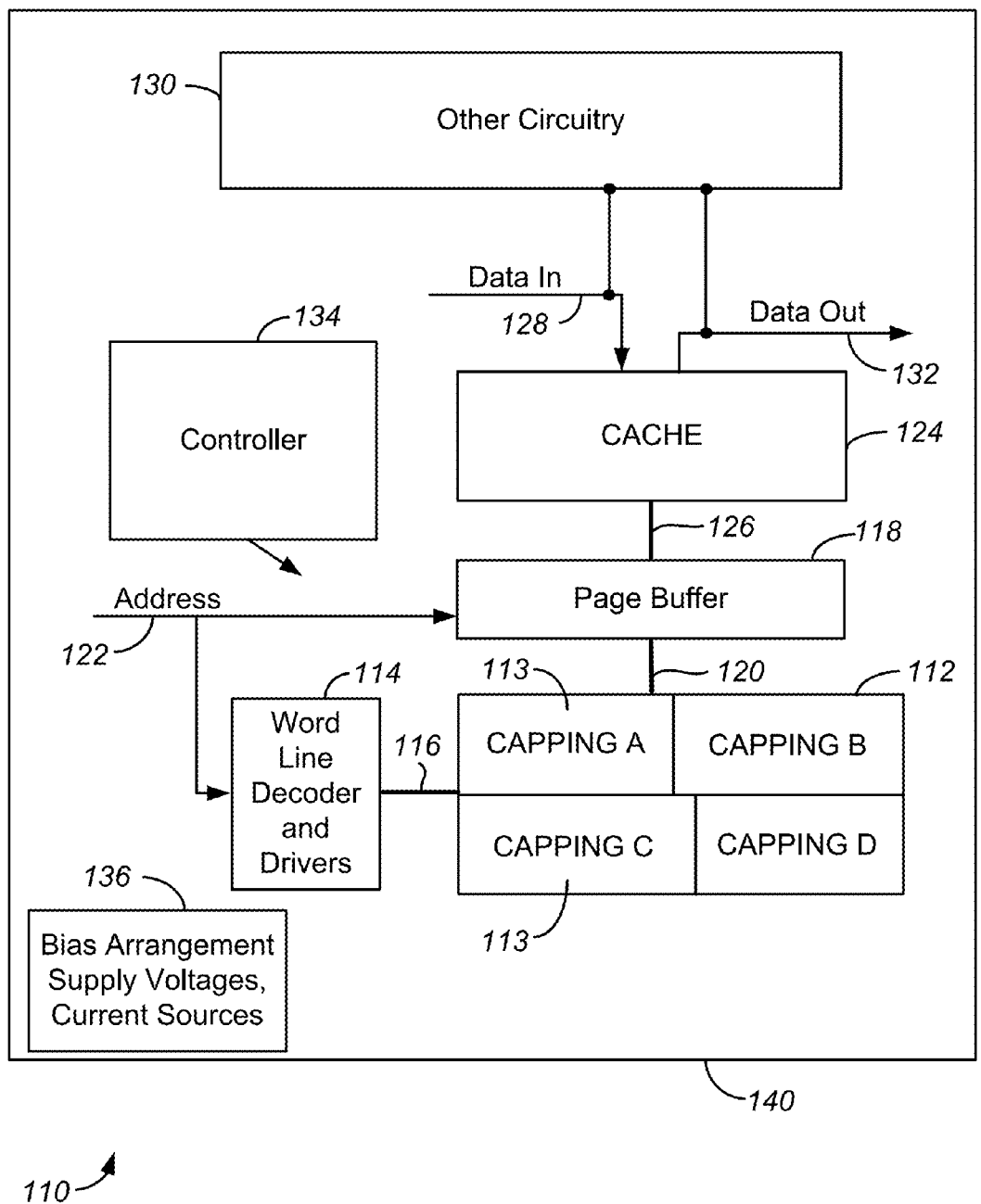
FIG. 7 is a block diagram of an example of an integrated circuit including a memory array including a plurality of sets of memory cells comprising phase change materials having different

FIG. 7 is a block diagram of an example of an integrated circuit 110 including a memory array 112. Memory array 112 includes a plurality of sets 113 of memory cells, 4 in this example. The different sets 113 of memory cells differ in the composition of the capping materials which are used as dielectrics (e.g. 36, 58) surrounding the programmable resistance materials, and are labeled Capping A-Capping D for the reasons discussed below. In one aspect of the invention, the memory cells in more than one of the sets of cells in the array 112 have a common cell structure, in the sense that the manufacturing process applied is designed to implement the same cell structure throughout the array, with the exception of the capping layer (e.g. layer 36 from FIGS. 2-5, and layer 58 from FIG. 6). Thus, in embodiments that can conserve manufacturing steps, the cells in one of the sets of memory cells can differ from the cell in the other sets of memory cells only in the composition of the capping layer.

A word line decoder 114 is coupled to and in electrical communication with a plurality of word lines 116 arranged along rows in the memory array 112. A page buffer 118 is in electrical communication with a plurality of bit lines 120 arranged along columns in the array 112 for reading, setting, and resetting the memory cells (not shown) in array 112. Addresses are supplied on bus 122 to word line decoder and drivers 114 and page buffer 118. Sense amplifiers and data-in structures in block 124, including voltage and/or current sources for read, set, and reset modes are coupled to page buffer 118 via data bus 126. Data is supplied via a data-in line 128 from input/output ports on integrated circuit 110, or from other data sources internal or external to integrated circuit 110, to data-in structures in block 124. Other circuitry 130 may be included on integrated circuit 110, such as a general purpose processor or special purpose application circuitry, or a combination of modules providing system-on-a-chip functionality supported by array 112. Data is supplied via a data-out line 132 from the sense amplifiers in block 124 to input/output ports on integrated circuit 110, or to other data destinations internal or external to integrated circuit 110.

A controller 134 implemented in this example, using a bias arrangement state machine, controls the application of bias arrangement supply voltages and current sources 136, such as read, set, reset and verify voltages and/or currents. The controller 134 controls the application the bias arrangement supply voltages and current sources 136 according to which of the sets 113 of memory cells of the array 112 is being accessed. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

The array 112 includes a plurality of sets or arrays 113 of memory cells, each of the sets comprising capping materials having different properties such that the sets of memory cells have different operational characteristics is described in more detail below. The sets 113 of memory cells are arranged at different locations in the array 112 and may be different numbers of cells, and in embodiments can be arranged in different units of the array 112, for example, different banks, blocks, or sections of the array 112.

Also, in other embodiments, different sets of cells in the array can have different peripheral circuits (e.g. word line drivers, sense amplifiers, control circuits) configured to match the performance specification of the unit. The peripheral circuitry including the controller or controllers and supporting circuits, such as the bias supply circuits, word line drivers and so on, provide circuitry to apply a write algorithm to the first plurality of memory cells (e.g. one of the sets 113) and a different write algorithm to the second plurality of memory cells (e.g. another of the sets 113). The peripheral circuits can also provide circuitry configured to apply a higher speed write operation to the first plurality of memory cells than to the second plurality of memory cells. The peripheral circuits can provide circuitry coupled to the first and second pluralities of memory cells configured to apply different write processes to them (e.g. shorter write pulses or write operations, for higher speed programming in one of the pluralities of memory cells, and longer write pulses or write operations, for longer data retention in the other), or to allocate them for different cycling endurance specifications (e.g. specifications for main memory that is accessed often in one of the pluralities of memory cells, or for long term storage in the other).

In some embodiments, logic such as a computer program on a host system outside the chip, or logic or computer programs executed on the same chip as the memory, can be used to allocate one of the sets of memory cells for memory that is accessed often and has a higher number of access cycles (e.g. as in main memory), and to allocate another of the sets for lower numbers of access cycles (e.g. as in longer term storage).

The operational memory characteristics of each set of memory cells in the array 112 can distinguished by the address of the memory cells. These characteristics of the cells determine the characteristics of the signals sent from controller 134 to couple bias circuitry (bias arrangement supply voltages, current sources 136) to apply pulses to operate (e.g. reading and writing operations) the memory cells of the array 112. For example, a write operation can include a set operation and a reset operation. A set operation of the first set of memory cells a first set pulse may be applied to the phase change memory cells in the first set of memory cells, and in a set operation of the second set of memory cells a second set pulse may be applied to the phase change memory cells in the second set of memory cells, the first and second set pulses having different values for at least one of pulse width and pulse height depending upon the operational memory and characteristics of the sets of memory cells. Similarly, in a reset operation of the first set of memory cells a first reset pulse may be applied to the phase change memory cells in the first set of memory cells, and in a reset operation of the second set of memory cells a second reset pulse may be applied to the phase change memory cells in the second set of memory cells, the first and second reset pulses having different values for at least one of pulse width and pulse height. In some embodiments, the drivers and sense amplifiers may consist of various types of circuitry corresponding to the sets of the memory cells and having different performance properties, and/or may be operable to different states depending upon which of set of memory cells an operation is to be performed on.

Figure 7A:
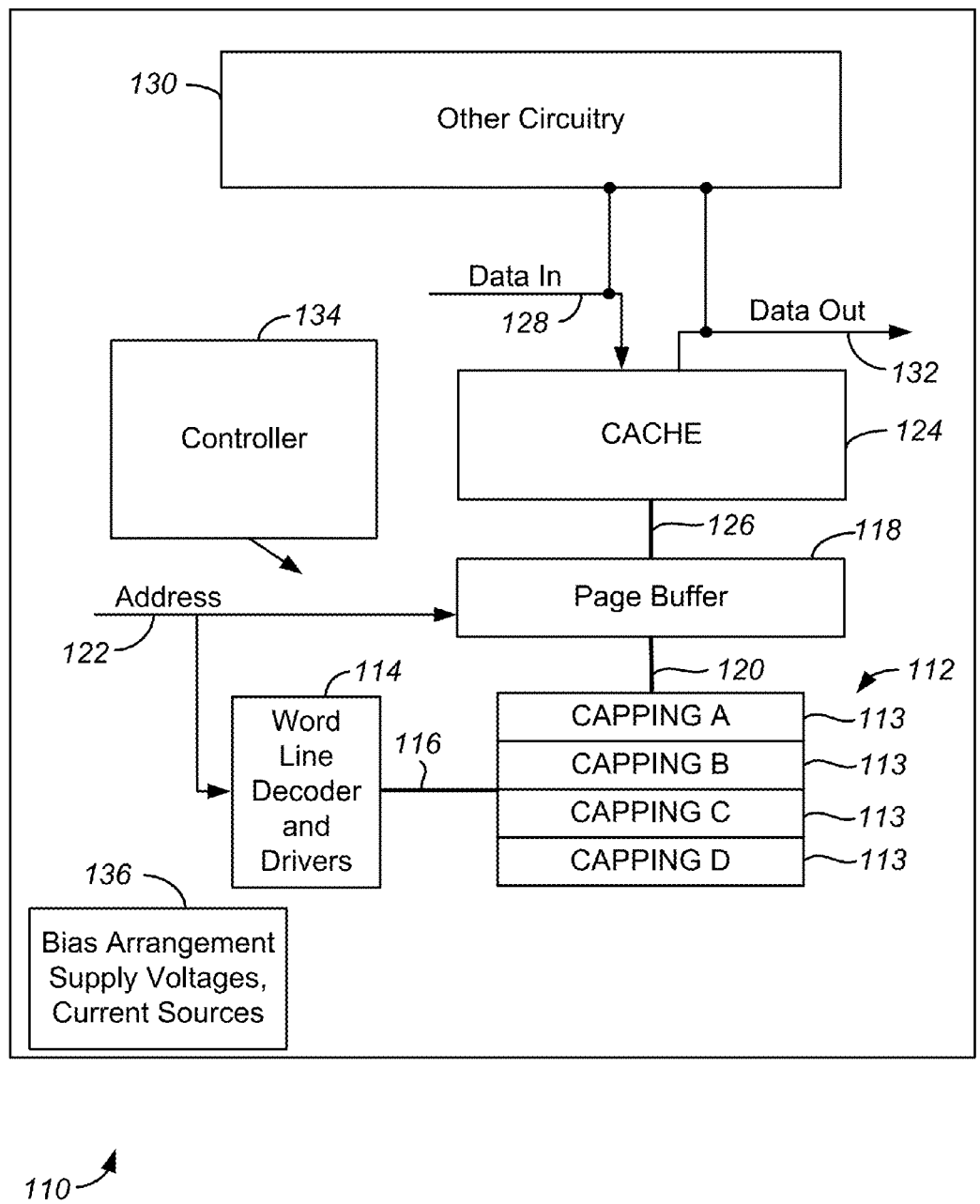
FIG. 7A illustrates an alternative to the integrated circuit of FIG. 7.
Figure 7B:
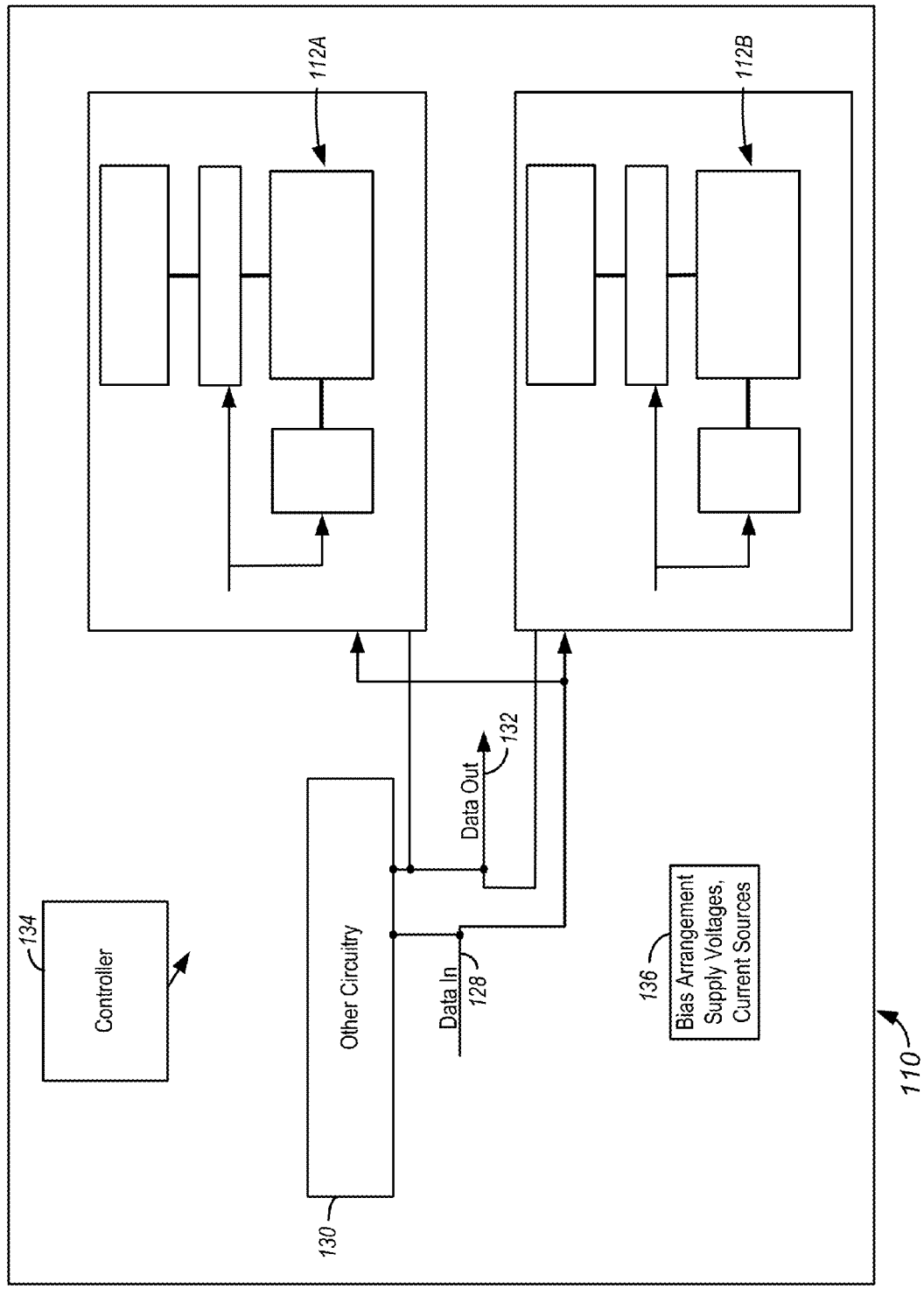
FIG. 7B illustrates a further alternative to the integrated circuit of FIG. 7.

FIG. 7A illustrates an alternative to the integrated circuit 110 of FIG. 7. In this example, the sets 113 of memory cells in the memory array 112 show an alternative arrangement of the sets 113 of memory cells. In the arrangement of FIG. 7A, the sets can all share the same global bit lines, for example, or the same column decoding circuitry, while being connected to different sets of word line drivers. FIG. 7B illustrates a further alternative to the integrated circuit 110 of FIG. 7. In this example, the operational characteristics for memory array 112A can be, for example, such to provide fast switching speed, and thus suitable for RAM applications, while the operational characteristics for memory array 112B can be, for example, such as to provide good data retention and thus be suitable for flash memory applications. In this example, some or all of the peripheral circuitry for the array 112A can be independent of the peripheral circuitry for the array 112B, allowing for optimization of the circuitry to match the specific performance needs. In the illustrated example, array 112A includes dedicated peripheral circuitry including word line decoder 114A, page buffer 118A and cache 124A Likewise, array 112B includes dedicated peripheral circuitry including word line decoder 114B, page buffer 118B and cache 124B. The arrays 112A and 112B share a controller 134, and bias arrangement supply voltages and current sources in block 136. Other circuitry 130 on the integrated circuit 110 is coupled for data flow communication with both arrays 112A and 112B.

Write operations for two or more sets 113 of memory cells of, for example, FIGS. 7-7B, can be carried out using a sequence of pulse/verify steps. Therefore, the length of a single pulse in for each set 113 of memory cells can be the same. However, a set 113 having memory cells with faster response times will, on average, succeed in the pulse/verify process with fewer pulses then a set 113 having memory cells with slower response times. The memory cells of different sets 113 can thus have a different write speeds. In some examples, the pulse/verify process may only require a single pulse.

Figure 8:
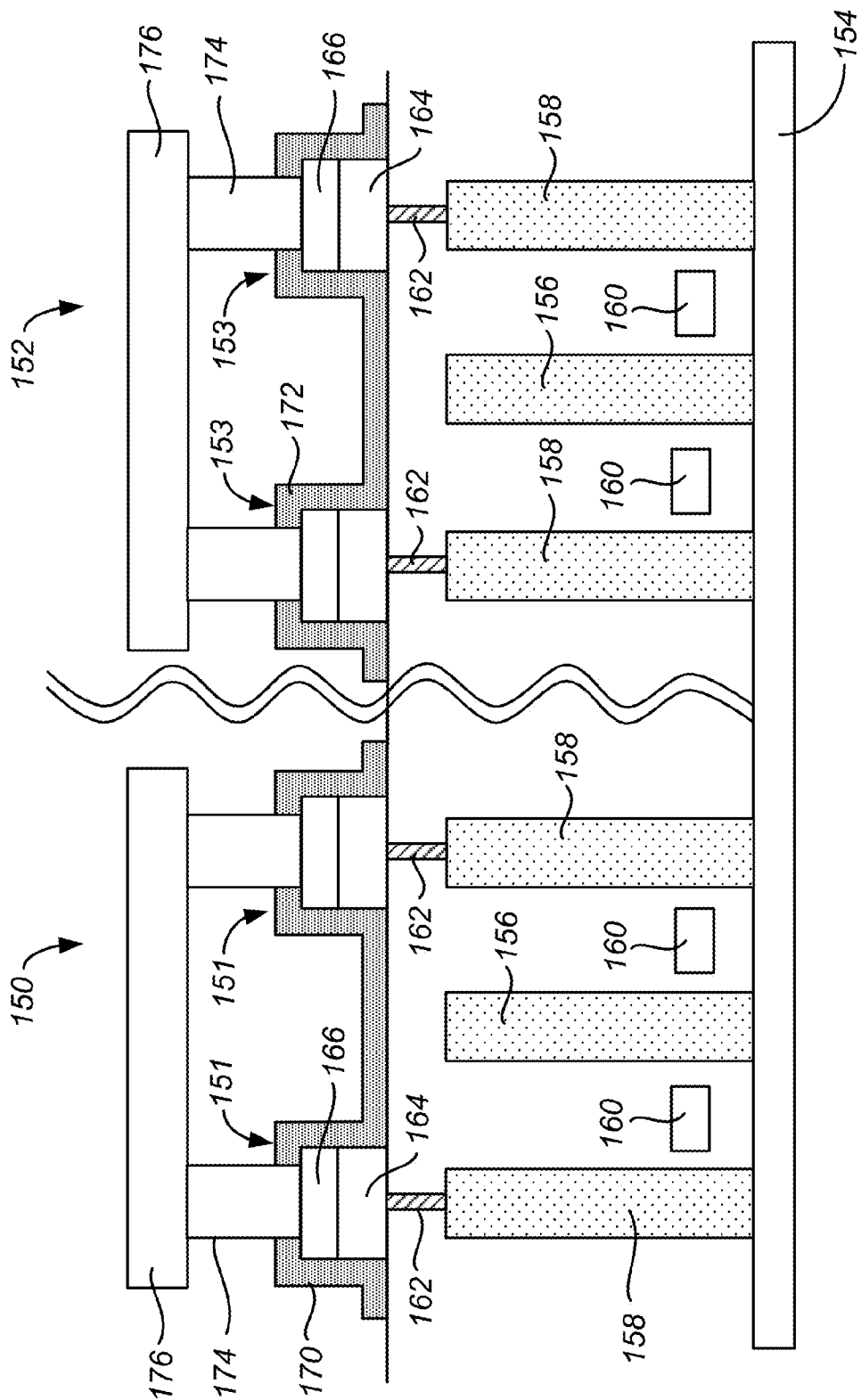
FIG. 8 illustrates one embodiment of the present invention.

FIG. 8 illustrates an example of the present technology carried out using a mushroom type memory cell. The technology can also be carried out with other types of memory cells, such as those discussed above with regard to FIGS. 3-6. As shown in FIG. 8, a first memory array 150, including first memory cells 151, and a second memory array 152, including second memory cells 153, are formed on a substrate 154 and correspond to two different sets 113 of memory cells of FIGS. 7-7B. First and second memory arrays 150, 152 have plugs 158 and word lines 160 which function, in this example, as gate electrodes. Plugs 158 connect to drain areas (not shown) of the substrate 154. Source lines 156 are grounded, functioning as common source. Source line 156 and plugs 158 are made of conductive material, metal or the like, such as tungsten, aluminum, cobalt, copper etc. Heaters or bottom electrodes 162 are coupled to the plugs 158 and are in contact with phase change material 164. The heater or bottom electrode 162 can comprise TiN or another conductive material. The phase change material 164 can be for example, a doped or non-doped $Ge_2Sb_2Te_5$. Top electrodes 166 are formed on the phase change material 164. The top electrodes 166 are also made of conductive material, which can be the same as or different from bottom electrodes 162.

A first capping material 170 is applied to the first memory array 150 to, in this example, conformably cover the phase change material 164 and the top electrodes 166. A second capping material 172 is applied to the second memory array 152, to conformably cover the phase change material 164 and the top electrodes 166. Portions of the first and second capping materials 170 and 172 are removed to form openings and expose top surface of the top electrodes 166. Vias 174 then are formed in the openings to connect top electrodes 166 and bit lines 176.

The only difference between the first and second memory arrays 150 and 152 is the capping materials 170, 172. The first memory array 150 is, in this example, capped with silicon nitride ($SiN_x$) deposited at low processing temperature (200° C.); this provides for fast switching and high cycling endurance suitable for RAM applications. The resulting first capping material 170 can have a lower density (<3.2 g/cm$^3$) and a lower refractive index (<2.016) relative to the second memory array 152 discussed below. In some examples, another capping layer can be used on top of first capping material 170. In some examples, a combination of capping materials of silicon oxide ($SiO_x$) and $SiN_x$ can be used as first capping material 170. In some examples, the first memory array 150 can be capped with combination of silicon nitride deposited at low processing temperature (200° C.) and silicon nitride deposited at high processing temperature (400° C.). Also, first capping material 170 can comprise a combination of layers of $SiN_x$ formed at different deposition temperatures. In other examples, the first capping material 170 for first memory array 150 can include low K materials, such as $S_oO_xF_yC_z$.

The second memory array 152 is, in this example, capped with silicon nitride deposited at a high processing temperature (400° C.); this provides for good data retention and possibly lower cycling endurance, suitable for non-volatile, relatively low data rate specifications similar to the specifications of flash memory for example. The resulting silicon nitride second capping material 172 can have a higher density (>=3.2 g/cm$^3$) and a higher refractive index (>=2.016) compared with silicon nitride first capping material 170 which can have a lower density of around 2.6 g/cm$^3$ in the lower refractive index of around 1.95. In some examples, the second capping material 172 for second memory array 152 can include high K materials such as $Al_2O_3$, $HfO_2$ and $Ta_2O_5$.

Figure 9:
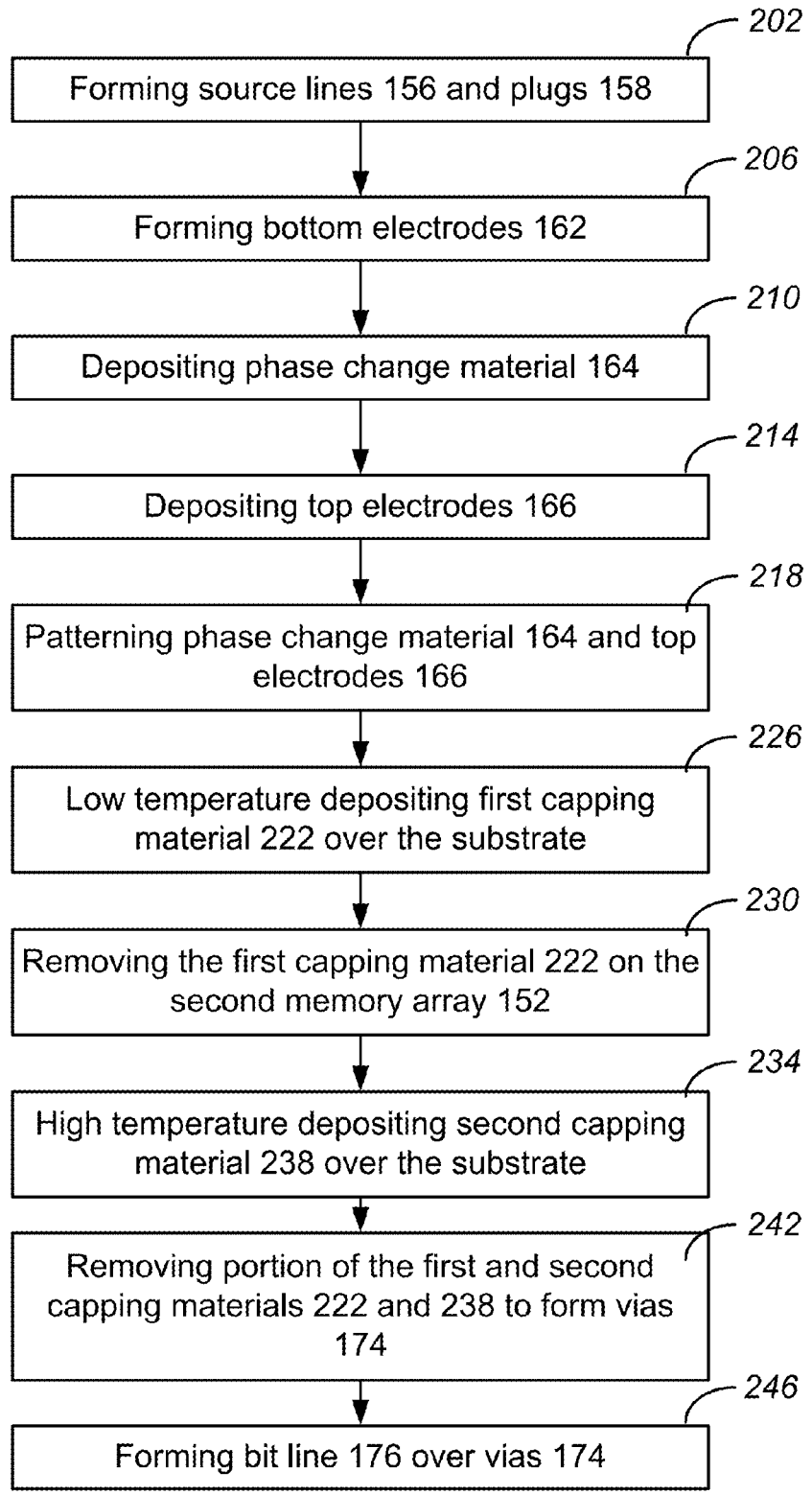
FIG. 9 illustrates process flow steps of one example for making memory arrays in which arrays of memory cells have different operational characteristics.

FIG. 9 is an exemplary process flow example for the embodiment of FIG. 8. The illustrated process flow does not show all process steps, but indicates steps of forming the memory cells of the first memory array 150 and the second memory array 152. Briefly, at step 202 source lines 156 and plugs 158 are formed over substrate 154. Bottom electrodes 162, which in some examples can act as heaters, are formed over plugs 158 at step 206. Phase change material 164 is deposited over bottom electrodes 162 at step 210. At step 214 top electrodes 166 are formed over phase change material 164. At step 218 phase change material 164 and top electrodes 166 are patterned to create the phase change material and top electrode structures as shown in in FIG. 8. In this example, at step 226 a lower density capping material 222 is deposited over the current substrate, in particular in contact with the phase change material 164 and the electrodes 166 for both first memory array 150 and second memory array 152. In this example, this process can be carried out at with deposition of $SiN_x$ at a low temperature, for example, at a temperature of 200° C. For the reaction gas, $SiH_4$ at 50 standard cubic centimeters per minute (sccm), $NH_3$ at 30 sccm, and $N_2$ at 500 sccm, can be used.

Next, at step 230 first capping material 222 is removed from the phase change material 164 and the electrodes 166 for second memory array 152. Next, at step 234 a high density capping material 238 is deposited over the current substrate, including covering the low density capping material 222 of the first memory array 150, see FIG. 10A, as well as the top electrode 166 and contacting phase change material 164 of the second memory array 152, see FIG. 10B. At step 242 a portion of the capping materials 222 and 238 covering each of the top electrodes 166 for both the first and second memory arrays 150, 152 is removed followed by forming conductive vias 174 over top electrodes 166. At step 246 bit lines 176 are formed extending over the vias 174 in the first memory array 150 and in the second memory array 152. In this example, this process can be carried out at with the deposition of $SiN_x$ at high temperature, such as at a temperature of 400° C. For the reaction gas, $SiH_4$ at 220 sccm, $NH_3$ at 125 sccm, and $N_2$ at 5000 sccm, can be used.

Figure 10A:
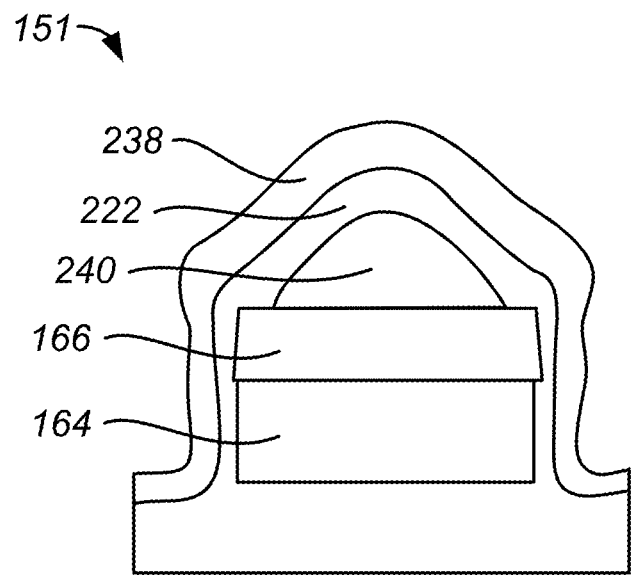
FIGS. 10A and 10B are drawings taken from TEM photos of different capping cells with FIG. is A showing a first memory cell and FIG. 10B showing a second memory cell, the first and second memory cells having different operational characteristics.
Figure 10B:
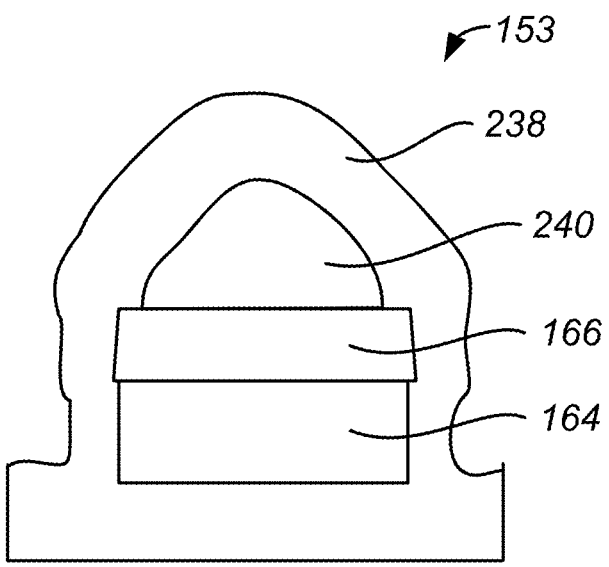

FIGS. 10A and 10B are drawings taken from TEM photos of different capped memory cells 151, 153 in accordance with the memory cells of first memory array 150 and the second memory array 152 in FIG. 8. A hard mask 240 is formed on the top electrodes 166. The memory cell 151 of the first memory array 150, see FIG. 10A, is shown capped with a combination of 20 nm of lower density silicon nitride made using a low temperature process (LT SiN) as a lower layer of first capping material 222, and 30 nm of higher density silicon nitride made using a high temperature process (HT SiN) as an upper layer of second capping material 238, the lower and upper layers constituting the first capping material 170. The resulting cell renders fast programming speed. In this example, the low and high temperatures were 200° C. and 400° C. respectively. The temperatures chosen depend on the particular manufacturing environment, and the desired nature of the deposited layer. The resulting memory cell 151 has the properties of fast switching, low density and low refractive index.

FIG. 10B shows memory cell 153 of the second memory array 152. The memory cell 153 of the second memory array 152 is capped with second capping material 238, in this example, 50 nm of high temperature silicon nitride (HT SiN). The resulting cell renders excellent data retention. The resulting memory cell 153 has the properties of good data retention.

Figure 11:
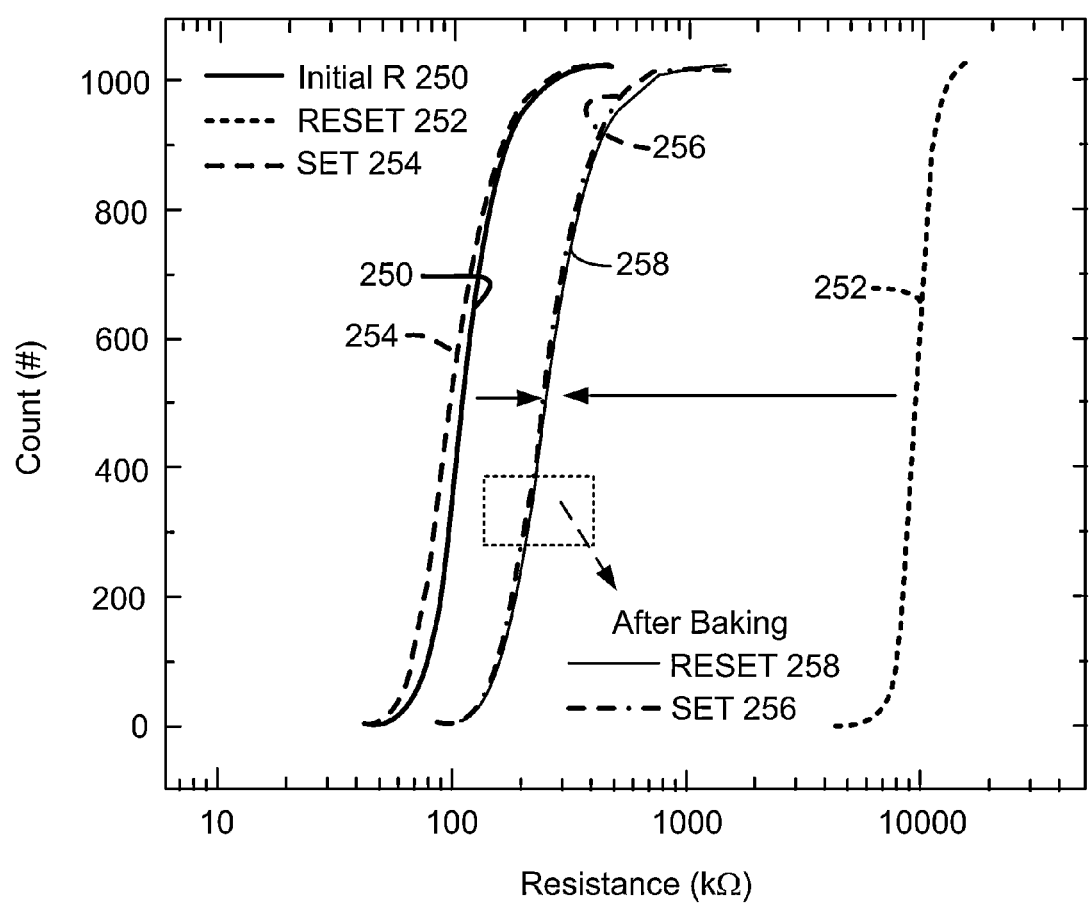
FIG. 11 illustrates a resistance distribution of before and after treatment at 150° C. for 30 minutes baking of lower density silicon nitride capping memory cells.

FIG. 11 illustrates a resistance distribution measured before and after baking of low temperature silicon nitride (LT SiN) capping memory cells at 150° C. for 30 minutes. Line 250 is a plot of initial resistance to count number with the memory cell in an initial, low resistance state. The count number refers to the number of cells in the array having the indicated resistance. Line 252 is a plot of resistance to count number after the memory cell has been placed in a reset, high resistance state. Line 254 is a plot of the resistance to count number for the memory cell after being placed in a set, low resistance state from the reset, high resistance state shown by line 252. Lines 250 and 254 closely follow one another illustrating that the initial resistance for LT SiN memory cells is close to the set, low resistance state.

Lines 256 and 258 are plots of resistance to count number with the memory cell at a set, low resistance state for line 256 and at a reset, high resistance state for line 258, both after the memory cell has been baked for 30 minutes at 150° C. as a measure of endurance. It can be seen that these two lines are merge after 30 minutes of baking at 150° C. as shown. Although, these LT SiN cells have fast switching time as discussed below, their retention is weak. In some examples, a refresh operation may be utilized to preserve data for the cells having this capping material.

Figure 12:
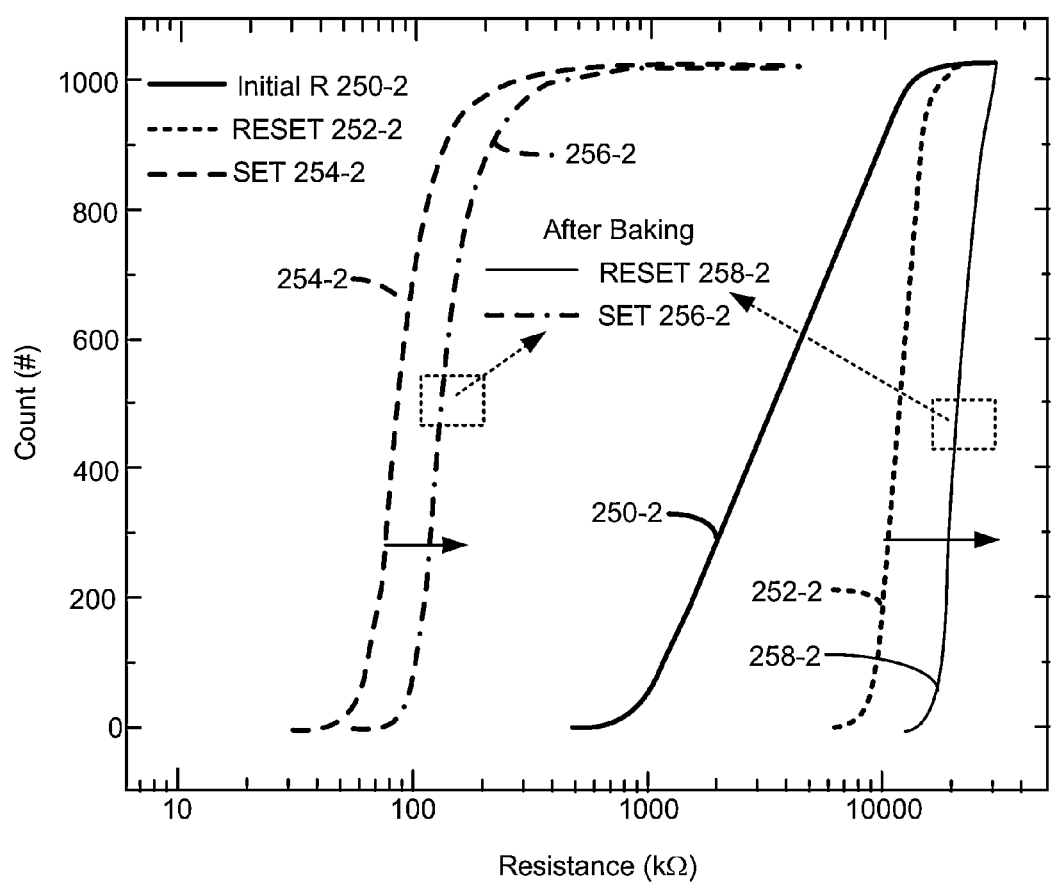
FIG. 12 illustrates a resistance distribution of before and after treatment at 150° C. for 30 minutes baking of higher density silicon nitride capping memory cells.

FIG. 12 illustrates a resistance distribution of before and after treatment at 150° C. for 30 minutes baking of high temperature silicon nitride (HT SiN) capping memory cells. Line 250-2 is a plot of initial resistance to count number with the memory cell in an initial, low resistance state. Line 252-2 is a plot of resistance to count number after the memory cell has been placed in a reset, high resistance state. Line 254-2 is a plot of the resistance to count number for the memory cell after being placed in a set, low resistance state from the reset, high resistance state shown by line 252-2.

Lines 256-2 and 258-2 are plots of resistance to count number with the memory cell at a set, low resistance state for line 256-2 and at a reset, high resistance state for line 258-2 after the memory cell has been baked for 30 minutes at 150° C. as a measure of endurance. It can be seen that set lines 254-2 and 256-2 closely parallel one another and reset lines 252-2 and 258-2 also closely parallel one another. Thus, there is a significant resistance difference between the set lines and the reset lines even after 30 minutes of baking at 150° C. as shown. Accordingly, in contrast to the distributions of cells with LT SiN capping, the resistance distributions of HT SiN capping cells as shown in FIG. 12, maintain a good memory window after the 30 minutes of baking at 150° C.

The initial resistance of memory cells having one capping material can be different than the initial resistance of memory cells having a different capping material. For LT SiN capping material memory cells, the initial resistance is similar to the SET resistance; see FIG. 11. The initial resistance of HT SiN capping material memory cells is closer to the RESET state resistance; see FIG. 12. Extrapolated 85° retention data of LT SiN capping material memory cells is shown in FIG. 13.

SET speed and data retention of phase change memory can be affected by the capping layer on the memory cells. Low density silicon nitride and low processing temperature capping material gives faster SET speed but relatively poor data retention. High density silicon nitride and high processing temperature capping material, on the other hand, gives excellent data retention but slower SET speed. Based on these discoveries, the present technology can provide a dual function phase change memory to fulfill the need of combining embedded DRAM and embedded Flash functions in a SOC chip to boost performance, reduce the power and lower the cost.

Figure 13:
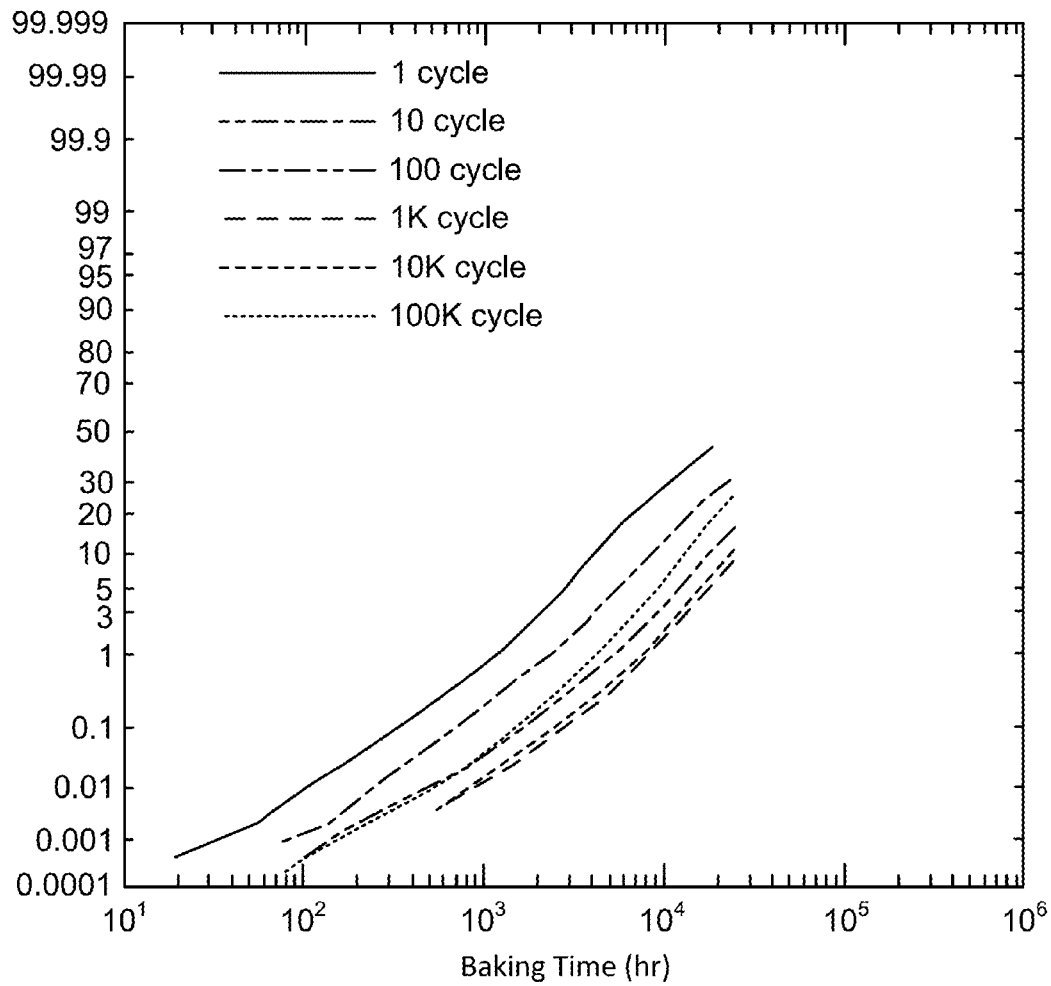
FIG. 13 is a plot of baking time versus the probability for data retention failure.

FIG. 13 is a plot of baking time at 85° C. versus cumulative probability for data retention failure for LT SiN capping memory cells with $Ge_2Sb_2Te_5$ memory material. This graph shows that fast switching, LT SiN capping memory cells can have a failure rate of 0.1% at about 1000 hours at 85° C. (10 cycle cells). Such a failure rate is not necessarily a problem in many applications where data are not saved for long periods of time; also, refresh operations can be scheduled to effectively eliminate any problem in this regard.

Figure 14:
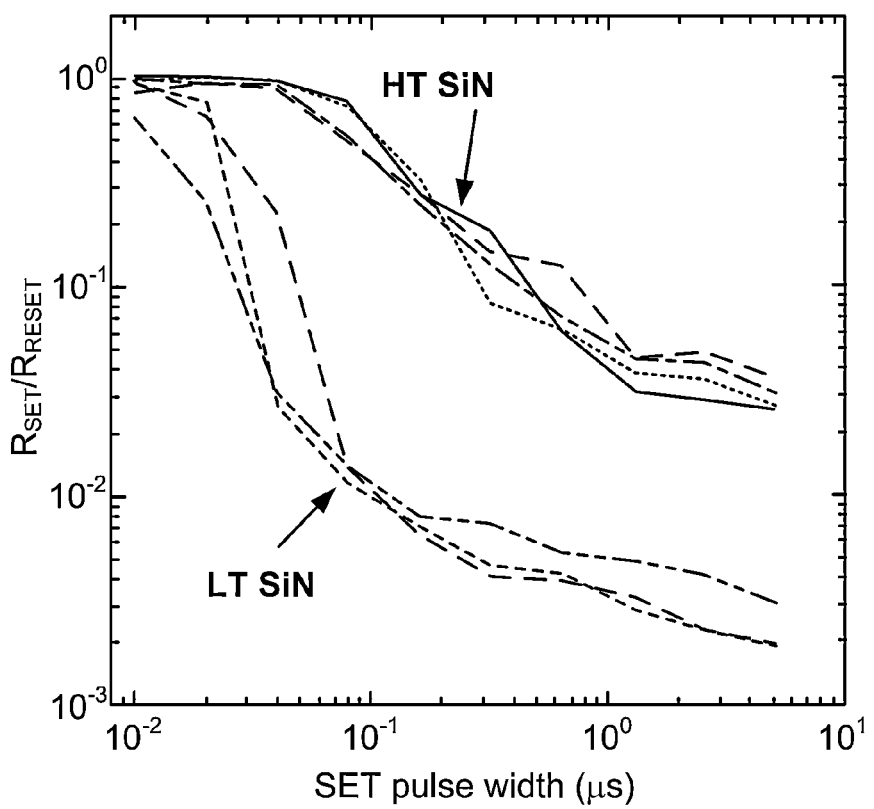
FIG. 14 is a plot of set pulse width versus the set/reset resistance ratio for LT SiN capping memory cells and HT SiN capping memory cells.

FIG. 14 a plot of set pulse width versus the set/reset resistance ratio for LT SiN capping memory cells and HT SiN capping memory cells. This plot illustrates the result of 10×10 memory arrays tester data of 7 different wafers, 3 LT SiN capping memory cells and 4 HT SiN capping memory cells. This shows that the tested LT SiN capping memory cells can be set within 50 ns for a 10× memory window, and the tested HT SiN capping memory cells need one microsecond to achieve the same memory window.

Figure 15A:
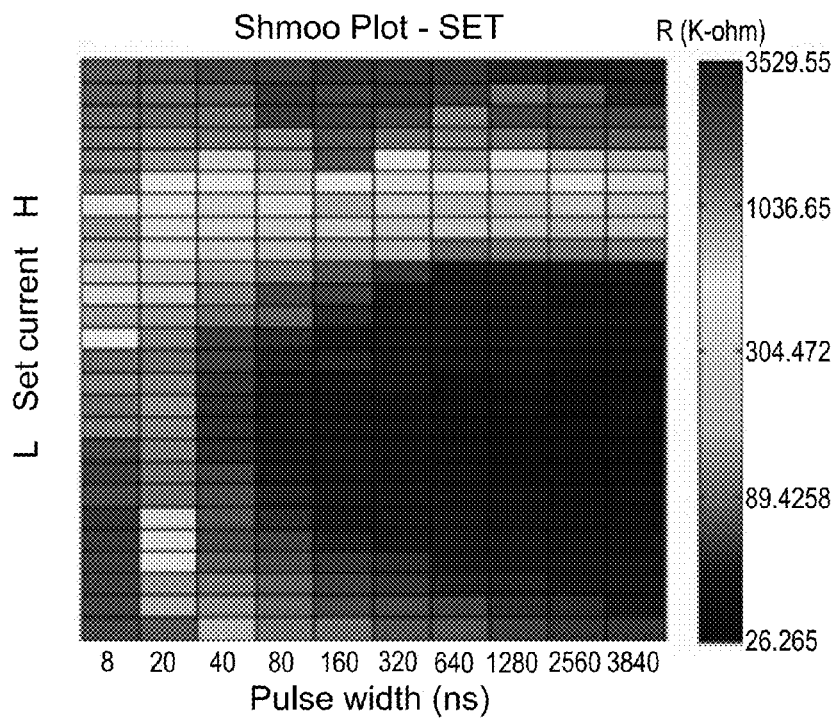
FIG. 15A is a shmoo plot for LT SiN capping material.
Figure 15B:
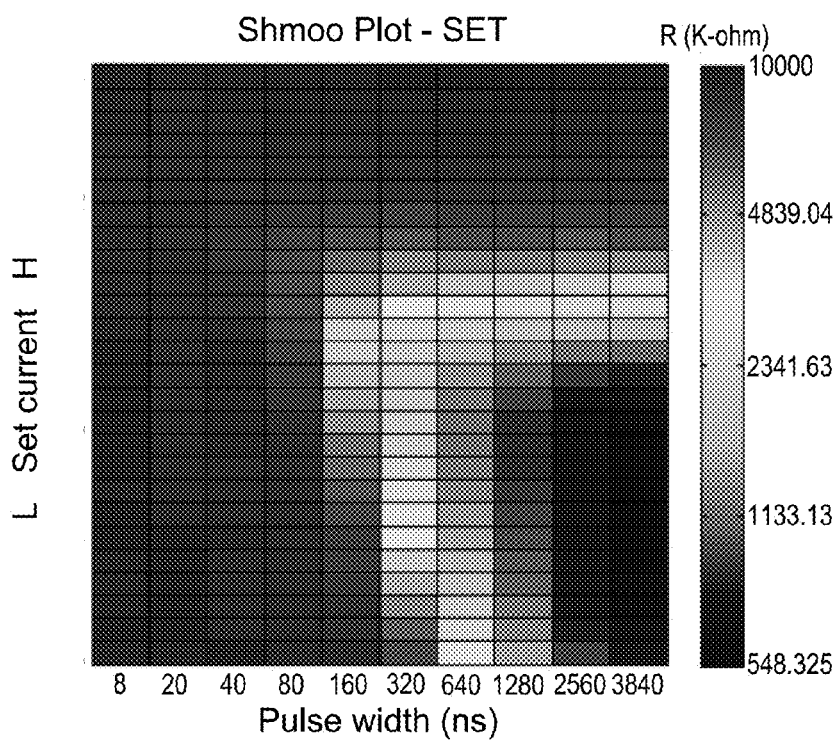
FIG. 15B is a shmoo plot for HT SiN capping material.

To illustrate the set condition to achieve fast the switching speed for a reset to set transition, set operation shmoo plots were created for doped $Ge_2Sb_2Te_5$ memory material cells. FIG. 15A is for LT SiN capping material while FIG. 15B is for HT SiN capping material. The rectangles within the plots are shaded according to the resistance. As shown in FIG. 15A, set operations of LT SiN capping memory cells were finished at a current range of 60 µA~125 µA within 20 ns. However, HT SiN capping memory cells required about 640 ns at a current range of 75 µA~150 µA to finish the set operation as shown in FIG. 15B. This plot illustrates that for LT SiN capping memory cells, more than 90% of bits can be set with 20 ns while all of the bits can be set below 30 ns.

Figure 16:
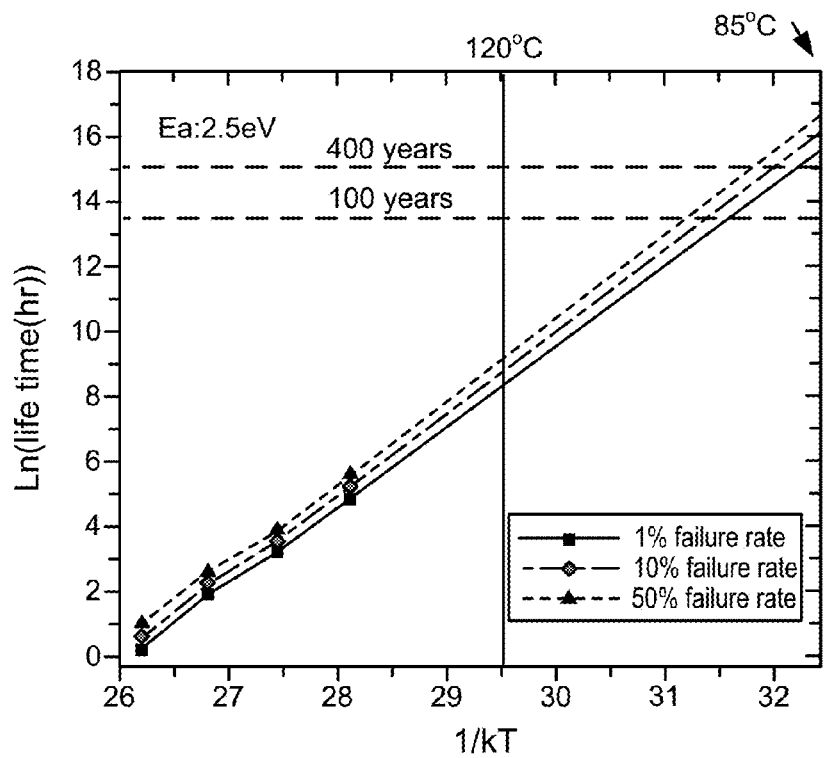
FIG. 16 plots a reciprocal of temperature versus lifetime on logarithmic scale of hours.

On the other hand, HT SiN capping memory cells, also with $Ge_2Sb_2Te_5$ memory material, show much better data retention. This is illustrated in FIG. 16 which plots a reciprocal of temperature (1/kT), where k is the Boltzmann constant and T is temperature with an estimated activation energy Ea of 2.5 eV, versus lifetime on logarithmic scale of hours. The lines corresponding, with 85° C. and 120° C. are indicated along the top, dashed lines for 100 years and 400 years drawn in as well. Based on this, at 85° C., 100 year failure rate is expected to be about 10 ppm while the 85° C. 400 year failure rate is expected to be about 0.1%.

Figure 17:
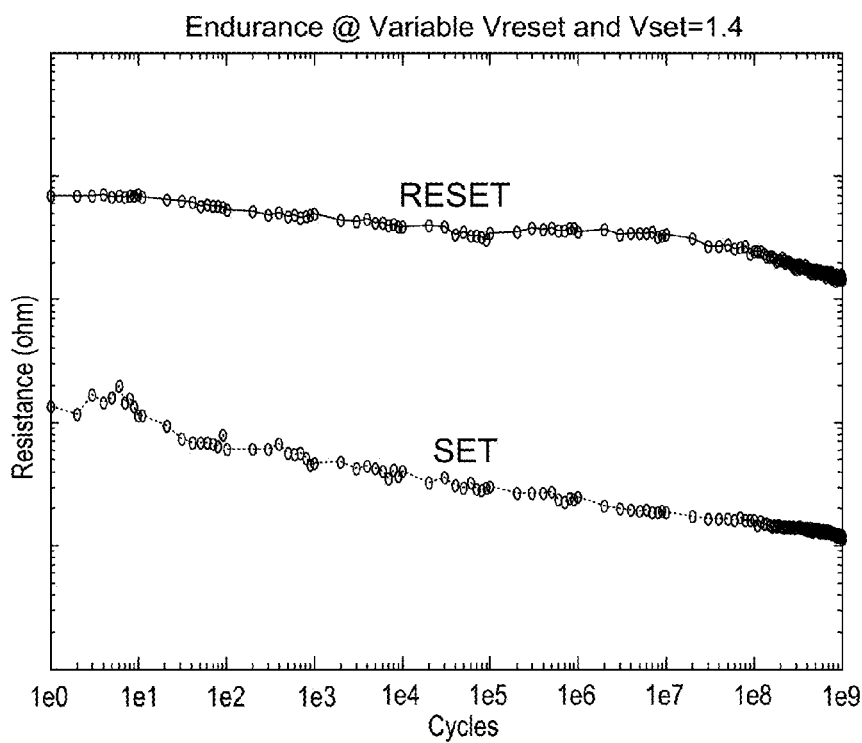
FIG. 17 is a cycling endurance plot for both the higher temperature reset state and the lower temperature set state.

FIG. 17 is a cycling endurance plot for an LT SiN capping memory cell in which resistance versus cycles is plotted for both the higher temperature reset state and the lower temperature set state. The cycling endurance of HT SiN capping memory cells is around $10^8$, which is much better than Flash memory. While LT SiN capping memory cells may not have the data retention lifetime which can be achieved by HT SiN capping memory cells, as shown in FIG. 17 they have superior cycling endurance. The cycling endurance for LT SiN capping memory cells can be more than $10^9$ cycles.

Any and all patents, patent applications and print publications referred to above are incorporated by reference.

The above descriptions may have used terms such as above, below, top, bottom, over, under, etc. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A system-on-chip memory device, comprising:
   a first plurality of memory cells comprising memory elements and a first capping material on the first plurality of memory cells;
   a second plurality of memory cells comprising the memory elements and a second capping material on the second plurality of memory cells;
   the first capping material being different from the second capping material and cell structures of the first plurality of memory cells and the second plurality of memory cells are same;
   wherein the first capping material comprising a silicon nitride, the second capping material comprising a silicon nitride having a higher density than the silicon nitride of the first capping material; and
   circuitry configured to apply a write algorithm to the first plurality of memory cells and a different write algorithm to the second plurality of memory cells to have different operational characteristics.

2. The device according to claim 1, wherein the memory elements comprising a programmable resistance memory material, and the first capping material and the second capping material contact the memory elements of the corresponding first and second pluralities of memory cells.

3. The device according to claim 1, wherein the memory elements comprising a GexSbyTez phase change material; and the second capping material deposited at a higher temperature than that of the first capping material.

4. The device according to claim 1, wherein the first capping material comprises a material with refractive index of less than 2.016 and greater than 1.8.

5. The device according to claim 1, wherein the first capping material comprises a material with density of less than 3.2 g/cm$^3$ and greater than 2.4 g/cm$^3$.

6. The device according to claim 1, the memory elements comprising a phase change material.

7. The device according to claim 1, wherein the memory cells of the first plurality of memory cells comprises a top electrode, a bottom electrode, and the memory elements, the memory elements being between the top and bottom electrodes, the first capping material contacting the memory elements.

8. A system-on-chip memory device, comprising:
   a first plurality of memory cells having a cell structure with memory elements comprising phase change material, and a first capping layer of silicon nitride contacting the memory elements in the first plurality of memory cells;
   a second plurality of memory cells having a cell structure with memory elements comprising phase change material, and a second capping layer of silicon nitride contacting the memory elements in the second plurality of memory cells, the cell structures of the first and second pluralities of memory cells differing only in the materials of the first and second capping layers; the silicon nitride in the first capping layer having a lower density than the silicon nitride in the second capping layer; and
   circuitry configured to apply a higher speed write operation to the first plurality of memory cells than to the second plurality of memory cells to have different operational characteristics.

* * * * *